United States Patent
Im et al.

(10) Patent No.: US 9,337,149 B2
(45) Date of Patent: May 10, 2016

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Dong-Hyun Im, Suwon-si (KR); Hyun Park, Suwon-si (KR); Soongun Lee, Hwaseong-si (KR); Chang Seok Lee, Siheung-si (KR); Sangwon Kim, Seoul (KR); Seongjun Park, Seoul (KR); Hyeon Jin Shin, Suwon-si (KR); Hanjin Lim, Seoul (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 14/681,313

(22) Filed: Apr. 8, 2015

(65) Prior Publication Data

US 2016/0035676 A1    Feb. 4, 2016

(30) Foreign Application Priority Data

Jul. 29, 2014  (KR) .................. 10-2014-0096665
Oct. 28, 2014  (KR) .................. 10-2014-0147258

(51) Int. Cl.
*H01L 27/02*    (2006.01)
*H01L 23/532*   (2006.01)
(Continued)

(52) U.S. Cl.
CPC .... *H01L 23/53276* (2013.01); *H01L 21/02527* (2013.01); *H01L 21/32139* (2013.01); *H01L 21/768* (2013.01); *H01L 23/528* (2013.01); *H01L 23/53209* (2013.01); *H01L 23/53214* (2013.01); *H01L 23/53228* (2013.01); *H01L 23/53257* (2013.01); *H01L 23/53271* (2013.01); *H01L 27/10814* (2013.01);

(Continued)

(58) Field of Classification Search
CPC ............ H01L 27/108; H01L 27/10814; H01L 27/10823; H01L 27/10855; H01L 27/1052; H01L 29/786; H01L 29/7869; H01L 29/267; H01L 29/82; H01L 49/02
USPC ........................................................ 257/532
See application file for complete search history.

(56) References Cited

U.S. PATENT DOCUMENTS 7,939,404 B2   5/2011  Jang
8,358,008 B2   1/2013  Wada et al.
(Continued)

FOREIGN PATENT DOCUMENTS

JP   2001178644 A   7/2001
JP   2011-201735    10/2011
(Continued)

OTHER PUBLICATIONS

Kang et al. "Effects of Multi-Layer Graphene Capping on Cu Interconnects" *Nanotechnology* 24 (2013) 115707 (5 pages).

*Primary Examiner* — Michael Lebentritt
(74) *Attorney, Agent, or Firm* — Myers Bigel & Sibley, P.A.

(57) ABSTRACT

Semiconductor devices may include a substrate including an active region defined by a device isolation layer, source/drain regions in the active region, word lines extending in a first direction parallel to the active region and being arranged in a second direction crossing the first direction, a bit line pattern extending in the second direction and crossing over a portion of the active region positioned between the word lines, and a graphene pattern covering at least a portion of the bit line pattern.

17 Claims, 40 Drawing Sheets

(51) Int. Cl.
*H01L 27/108* (2006.01)
*H01L 23/528* (2006.01)
*H01L 21/02* (2006.01)
*H01L 21/3213* (2006.01)
*H01L 29/06* (2006.01)
*H01L 21/768* (2006.01)

(52) U.S. Cl.
CPC ... *H01L 27/10852* (2013.01); *H01L 27/10873* (2013.01); *H01L 27/10885* (2013.01); *H01L 27/10888* (2013.01); *H01L 29/0642* (2013.01)

(56) References Cited

U.S. PATENT DOCUMENTS

| | | |
|---|---|---|
| 8,378,335 B2 | 2/2013 | Yamazaki et al. |
| 8,404,588 B2 | 3/2013 | Kim et al. |
| 8,476,765 B2 | 7/2013 | Zhang et al. |
| 8,482,126 B2 | 7/2013 | Wada et al. |
| 8,507,797 B2 | 8/2013 | Veerasamy |
| 2012/0080662 A1 | 4/2012 | Saito et al. |
| 2012/0168723 A1 | 7/2012 | Park |
| 2012/0181510 A1 | 7/2012 | Avouris et al. |
| 2012/0243308 A1* | 9/2012 | Saida ............. G11C 11/161 365/173 |
| 2013/0075700 A1 | 3/2013 | Yang et al. |
| 2013/0134592 A1 | 5/2013 | Yamazaki et al. |
| 2013/0334632 A1* | 12/2013 | Park ............... H01L 27/224 257/421 |
| 2014/0097404 A1* | 4/2014 | Seo ............... H01L 29/1606 257/29 |
| 2014/0362652 A1* | 12/2014 | Luo ............... G11C 11/404 365/191 |
| 2014/0376296 A1* | 12/2014 | Lee ............... G11C 11/5657 365/145 |
| 2015/0171159 A1* | 6/2015 | Lim ............... H01L 27/10814 257/532 |

FOREIGN PATENT DOCUMENTS

| | | |
|---|---|---|
| JP | 2013-144621 | 7/2013 |
| KR | 20130122429 A | 11/2013 |

* cited by examiner

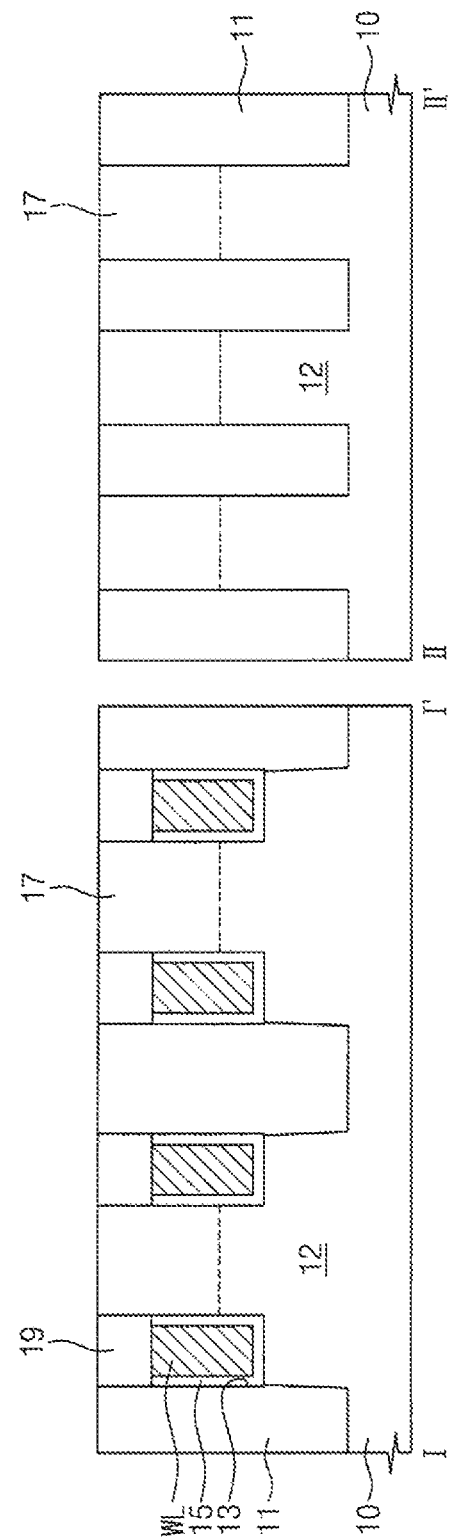

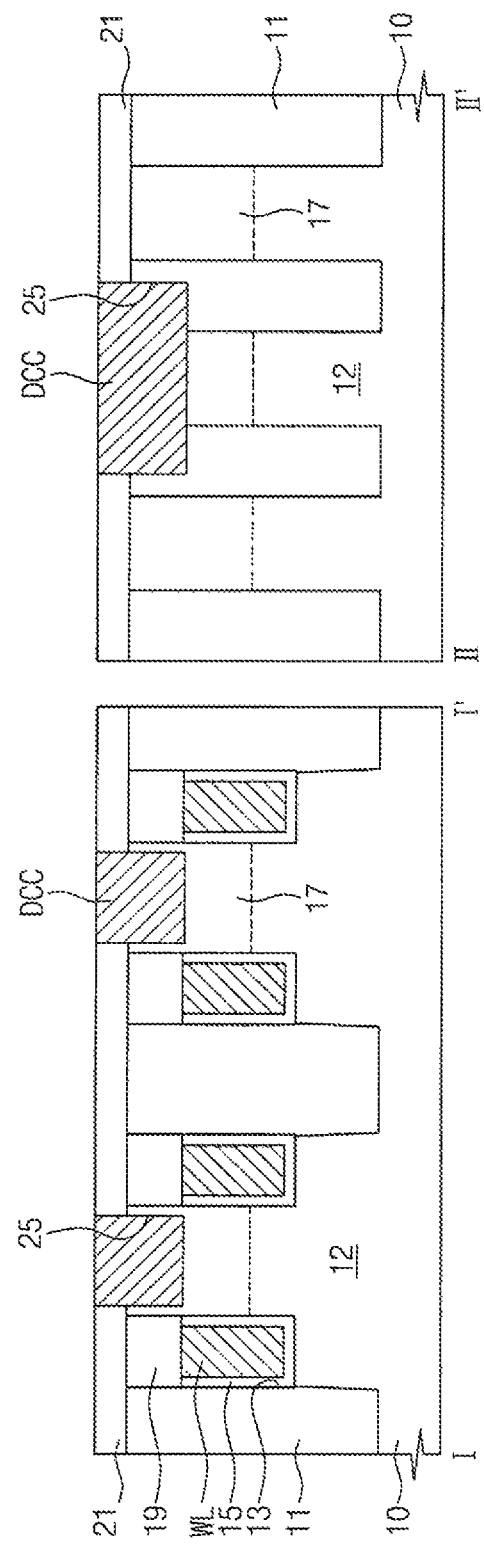

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2014-0096665, filed on Jul. 29, 2014, and Korean Patent Application No. 10-2014-0147258, filed on Oct. 28, 2014, in the Korean Intellectual Property Office, the disclosures of which are incorporated by reference herein in their entirety

BACKGROUND OF THE INVENTION

Integrated circuits have, to a large extent, followed Moore's law of increasing device density for decades. Increased density provides significant benefits to end-users in price, performance, portability, and reliability. However, as integrated circuits continue to pack more and more circuitry into a given area, some mechanisms threaten to diminish the devices' reliability. For example, as device density increases, line widths of patterns decreases, and this leads to an increase in specific resistance of electrode patterns and deterioration in electrical characteristics of the integrated circuits.

SUMMARY

Example embodiments of present the inventive concepts provide semiconductor devices with improved electrical characteristics.

Example embodiments of the present inventive concepts provide methods of fabricating semiconductor devices with improved electrical characteristics.

According to example embodiments of the present inventive concepts, a semiconductor device may include a substrate including an active region defined by a device isolation layer, source/drain regions in the active region, word lines that extend in a first direction parallel to the active region and that are arranged in a second direction crossing the first direction, a bit line pattern that extends in the second direction and that crosses over a portion of the active region positioned between the word lines, and a graphene pattern that covers at least a portion of the bit line pattern.

According to example embodiments of the present inventive concepts, a method of fabricating a semiconductor device may include forming an electrode layer on a substrate, forming a graphene layer on the electrode layer, forming a mask pattern on the graphene layer, and etching the graphene layer and the electrode layer using the mask pattern as an etch mask to form an electrode pattern. The forming of the graphene layer may include supplying a hydrogen gas on the electrode layer that couples hydrogen atoms onto a surface of the electrode layer, supplying a carbon-containing reaction gas on the electrode layer that replaces the hydrogen atoms with carbon atoms and growing the graphene layer from the carbon atoms.

According to example embodiments of the present inventive concepts, a method of fabricating a semiconductor device may include forming a mask pattern on the graphene layer, etching the electrode layer using the mask pattern as an etch mask to form a pattern, and forming a graphene pattern to cover a sidewall of the pattern. The forming of the graphene layer may include supplying a hydrogen gas on the pattern that couples hydrogen atoms onto a surface of the pattern, supplying a carbon-containing reaction gas on the pattern that replaces the hydrogen atoms with carbon atoms and that couples the carbon atoms onto the surface of the pattern, and growing the graphene layer from the carbon atoms.

According to example embodiments of the present inventive concepts, a semiconductor device may include a substrate comprising an active region defined by a device isolation layer, a bit line that crosses over a portion of the active region and that comprises a plurality of bit line patterns that are sequentially stacked on the substrate and a graphene pattern that is on one of the plurality of bit line patterns, and an interlayered insulating layer on the substrate, on the plurality of bit line patterns and on the graphene pattern. The at least one bit line pattern of the plurality of bit line patterns may comprise a different material than another one of the plurality of bit line patterns.

BRIEF DESCRIPTION OF THE DRAWINGS

Example embodiments of the present inventive concepts will be more clearly understood from the following brief description taken in conjunction with the accompanying drawings. The accompanying drawings represent non-limiting, example embodiments as described herein.

FIGS. 9A through 9L are sectional views taken along lines I-I' and II-II' of FIG. 1 to illustrate methods of fabricating semiconductor devices, according to example embodiments of the present inventive concepts.

Figure 1:
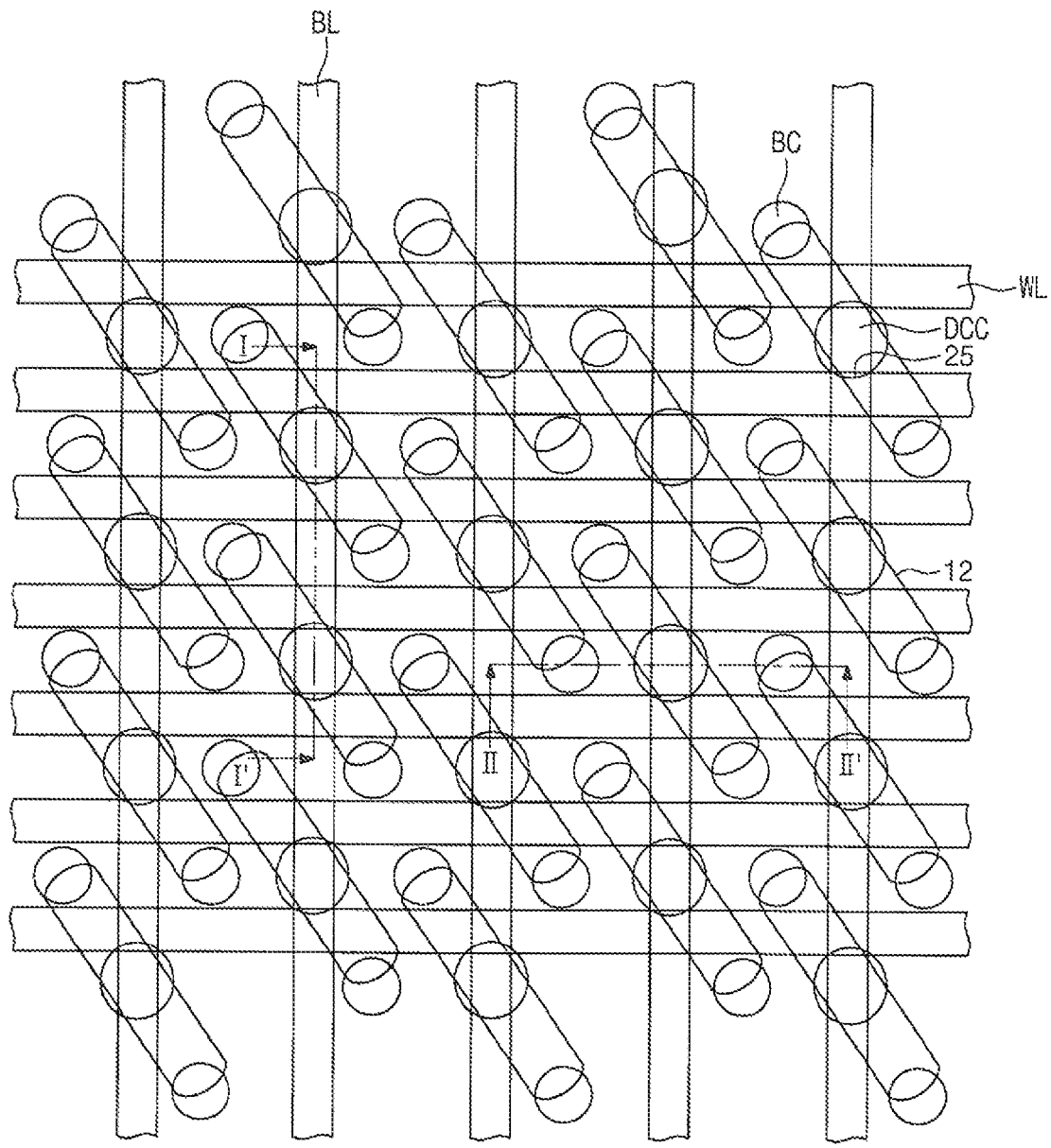
FIG. 1 is a plan view illustrating semiconductor devices according to example embodiments of the present inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventive concepts will now be described more fully with reference to the accompanying drawings, in which example embodiments are shown. Example embodiments of the present inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the present inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
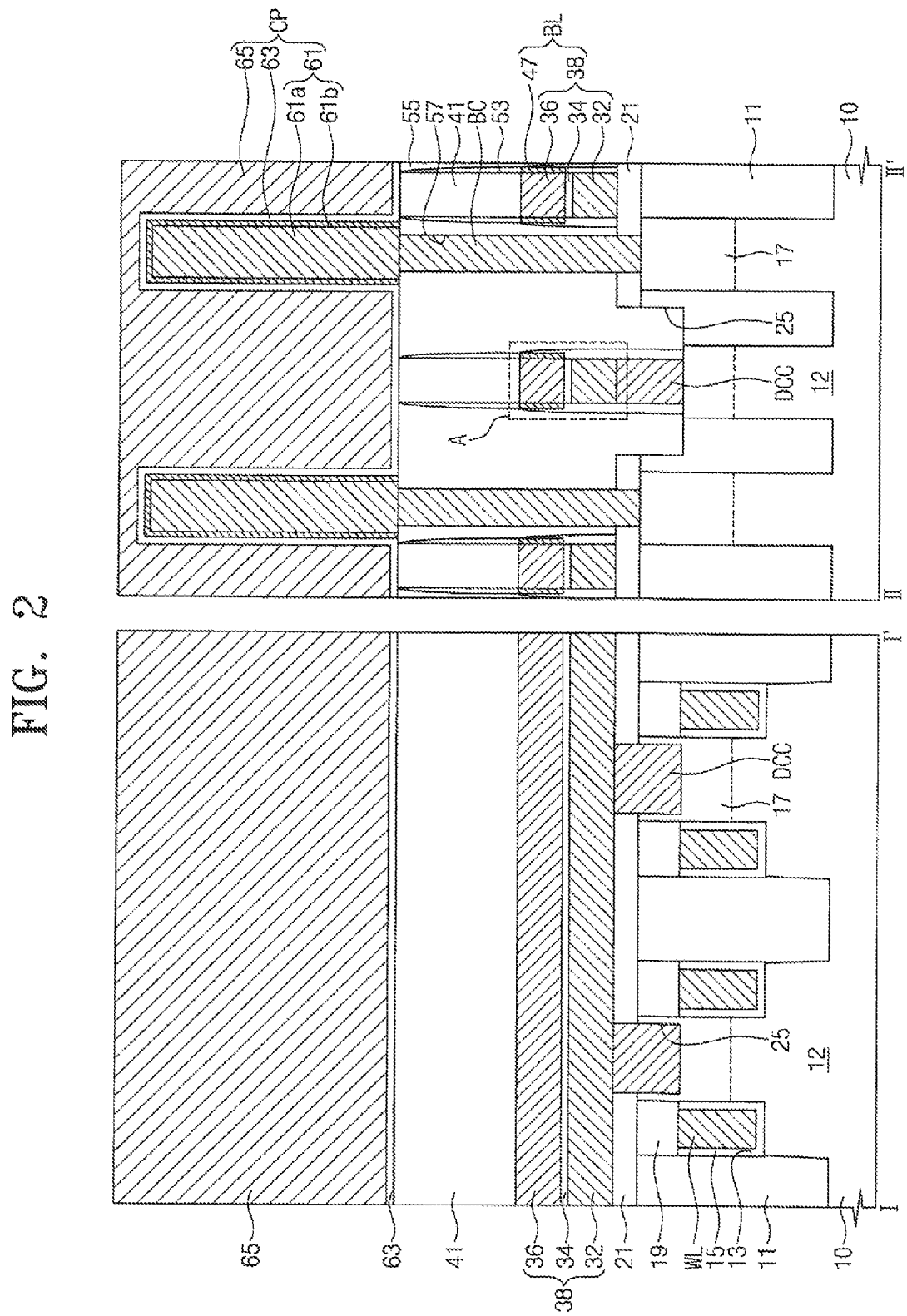
FIG. 2 is a sectional view taken along lines I-I' and II-II' of FIG. 1 to illustrate semiconductor devices according to example embodiments of the present inventive concepts.

FIG. 1 is a plan view illustrating semiconductor devices according to several example embodiments of the present inventive concept. FIG. 2 is a sectional view taken along lines I-I' and II-II' of FIG. 1 to illustrate semiconductor devices according to example embodiments of the present inventive concepts.

Referring to FIGS. 1 and 2, a device isolation layer 11 including an insulating material may be formed on a substrate 10. The device isolation layer 11 may define an active region 12. In example embodiments, a plurality of active regions 12 may be formed parallel to each other, ones of which may be shaped like a bar extending in a third, or z, direction. Source/drain regions 17 may be provided in ones of the active regions 12.

Word lines WL may be provided in the substrate 10 to cross the active region 12. For example, the word lines WL may be provided parallel to a first, or x, direction crossing the third, or z, direction. The word lines WL may be formed in such a way that two adjacent word lines are provided on ones of the active regions 12. The word lines WL may be arranged in a second, or y, direction, which may be perpendicular to the first, or x, direction. A gate insulating layer 15 may be provided to cover an external surface of the word line WL. Buffer insulating patterns 19 may be provided on the word lines WL and the gate insulating layer 15. The buffer insulating pattern 19 may have a top surface that is substantially coplanar with that of the substrate 10. A first interlayered insulating layer 21 may be provided on the substrate 10 to cover the source/drain regions 17.

Bit line node contact holes 25 (hereinafter, contact holes) may be formed between the word lines WL to expose the active regions 12, respectively. The contact holes 25 may be formed to penetrate the first interlayered insulating layer 21 and may have a bottom surface that is lower than the top surface of the substrate 10. A width of the contact hole 25 in the first, or x, direction may be substantially equal to that in the second, or y, direction. Bit line node contacts DCC (hereinafter, BL contacts) may be provided in the contact holes 25, respectively. The BL contact DCC may have a width that is smaller than that of the contact hole 25.

Bit lines BL may be provided on the BL contact DCC. The bit lines BL may be formed parallel to the second, or y, direction and may cross over the active regions 12. The bit lines BL may be disposed parallel to each other. In some embodiments, a bit line BL may include a bit line pattern 38 and a graphene pattern 47. Bit line pattern 38 may include a first bit line pattern 32, a second bit line pattern 34, and a third bit line pattern 36 sequentially stacked on the substrate 10. The first bit line pattern 32 may include, for example, polysilicon or doped polysilicon. As an example, the first bit line pattern 32 may be formed of or include polysilicon. The second bit line pattern 34 may be formed of a diffusion barrier metal (e.g., TiN, Ti/TiN, TiSiN, TaN, and/or WN). As an example, the second bit line pattern 34 may be formed of or include TiN. The third bit line pattern 36 may include, for example, tungsten (W), aluminum (Al), copper (Cu), nickel (Ni), and/or cobalt (Co). As an example, the third bit line pattern 36 may be formed of or include tungsten (W).

As shown in the drawings, ones of the BL contacts DCC may have substantially the same width as that of the bit line pattern 38 thereon. In certain embodiments, a width of a top surface of the BL contact DCC adjacent to the first bit line pattern 32 may be smaller than a width of a bottom surface of the BL contact DCC adjacent to a bottom surface of the contact hole 25.

The graphene pattern 47 may be provided on a sidewall of the third bit line pattern 36.

Figure 7A:
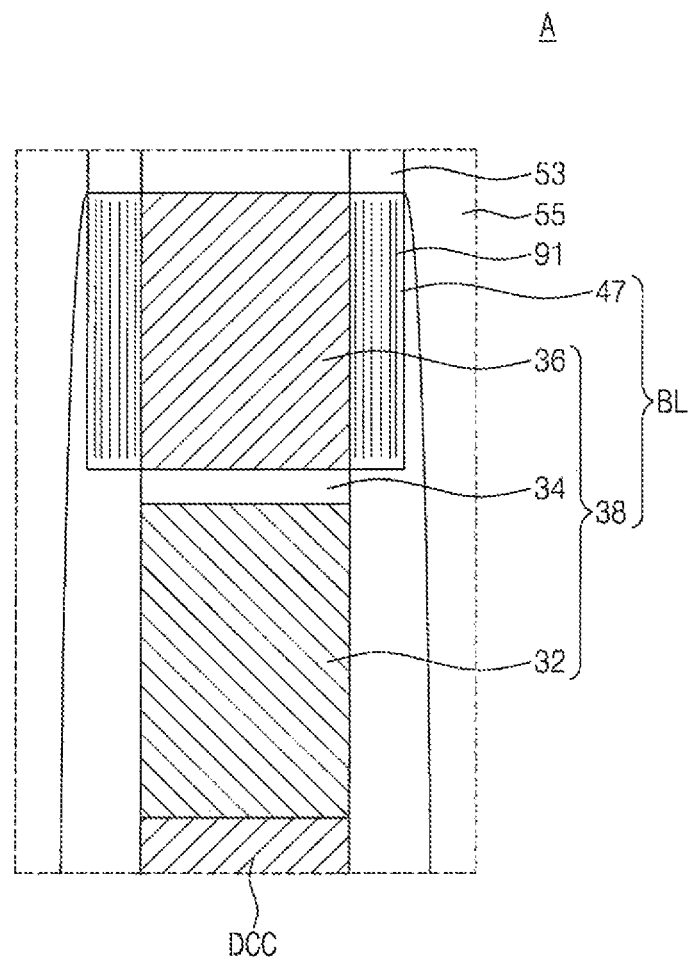
FIG. 7A is an enlarged sectional view illustrating a portion (e.g., the portion A of FIG. 2) of semiconductor devices according to example embodiments of the present inventive concepts.
Figure 7B:
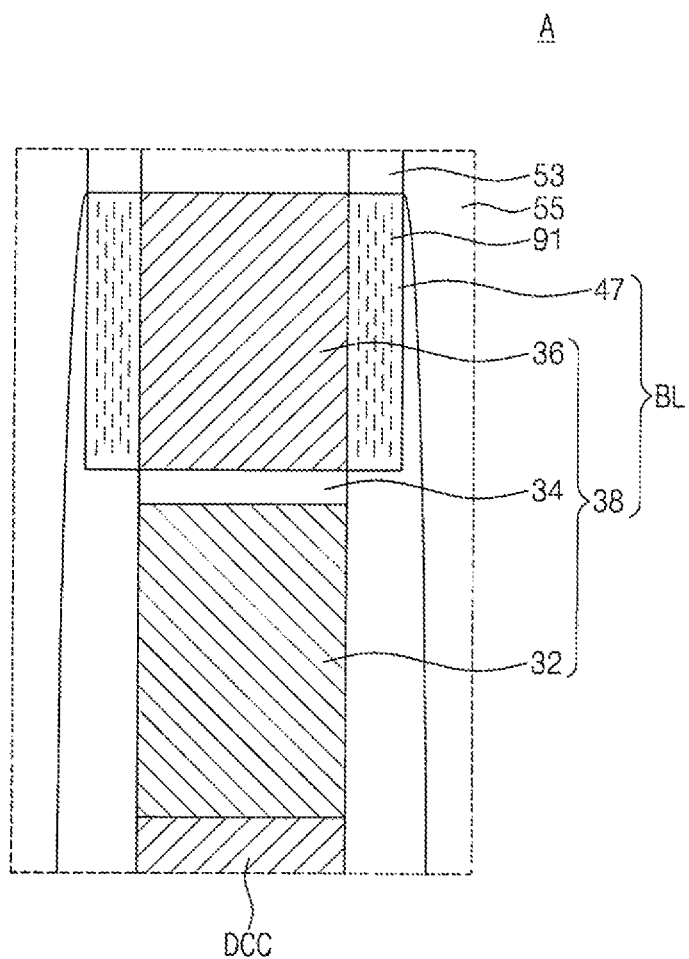
FIG. 7B is an enlarged sectional view illustrating a portion (e.g., the portion A of FIG. 2) of semiconductor devices according to other example embodiments of the present inventive concepts.

Referring to FIG. 7A, the graphene pattern 47 may include a plurality of graphene films 91, which are sequentially stacked on a sidewall of the third bit line pattern 36. Here, ones of the graphene films 91 may be a continuous layer that is parallel to the sidewall of the third bit line pattern 36. According to the embodiments of FIG. 7A, the graphene pattern 47 may be provided to have a single crystalline structure. Referring to FIG. 7B, the graphene pattern 47 may also include a plurality of graphene films 91, which are sequentially stacked on the sidewall of third bit line pattern 36. Here, ones of the graphene films 91 may be a discontinuous layer that is parallel to the sidewall of the third bit line pattern 36. According to the embodiments of FIG. 7B, the graphene pattern 47 may be provided to have a polycrystalline structure. The bit line pattern 38 and the graphene pattern 47 may serve as the bit line BL.

Referring back to FIGS. 1 and 2, an insulating pattern 41 may be provided on the bit line pattern 38.

A second interlayered insulating layer 55 may be disposed on the first interlayered insulating layer 21. The second interlayered insulating layer 55 may be provided to expose a top surface of the insulating pattern 41 and fill portions of the contact hole 25. In some embodiments, the second interlayered insulating layer 55 may completely fill the contact hole 25. Storage node contacts BC (hereinafter, storage contacts) may be provided to penetrate the first interlayered insulating layer 21 and the second interlayered insulating layer 55. The storage contacts BC may be provided on edge regions of the active region 12 and may be electrically connected to the source/drain regions 17, respectively.

Capacitors CP may be provided on the second interlayered insulating layer 55 to be in contact with the storage contacts BC, respectively. In some embodiments, a capacitor CP may include a lower electrode 61, a dielectric layer 63, and an upper electrode 65. The lower electrode 61 may have a cylindrical shape. The dielectric layer 63 may be formed to conformally cover the lower electrode 61, and the upper electrode 65 may be provided on the second interlayered insulating layer 55 to cover the dielectric layer 63. The lower electrode 61 may include a first lower electrode 61a and a second lower electrode 61b. In example embodiments of the present inventive concepts, the second lower electrode 61b may be provided on a surface of the first lower electrode 61a. The first lower electrode 61a may include, for example, titanium nitride (TiN), titanium/titanium nitride (Ti/TiN), titanium silicon nitride (TiSiN), tantalum nitride (TaN), tungsten nitride (WN), tungsten (W), aluminum (Al), copper (Cu), nickel (Ni), cobalt (Co), polysilicon, and/or doped polysilicon. The second lower electrode 61b may include graphene. The second lower electrode 61b may include a plurality of graphene films (e.g., 91 of FIG. 7A), ones of which are formed to cover the surface of the first lower electrode 61a in a substantially continuous and parallel manner. The second lower electrode 61b may be provided to have a single crystalline structure. The second lower electrode 61b may include a plurality of graphene films (e.g., 91 of FIG. 7B), ones of which are formed to cover the surface of the first lower electrode 61a in a substantially discontinuous and parallel manner. For example, the second lower electrodes 61b may be formed to have a poly-crystalline structure.

Figure 3:
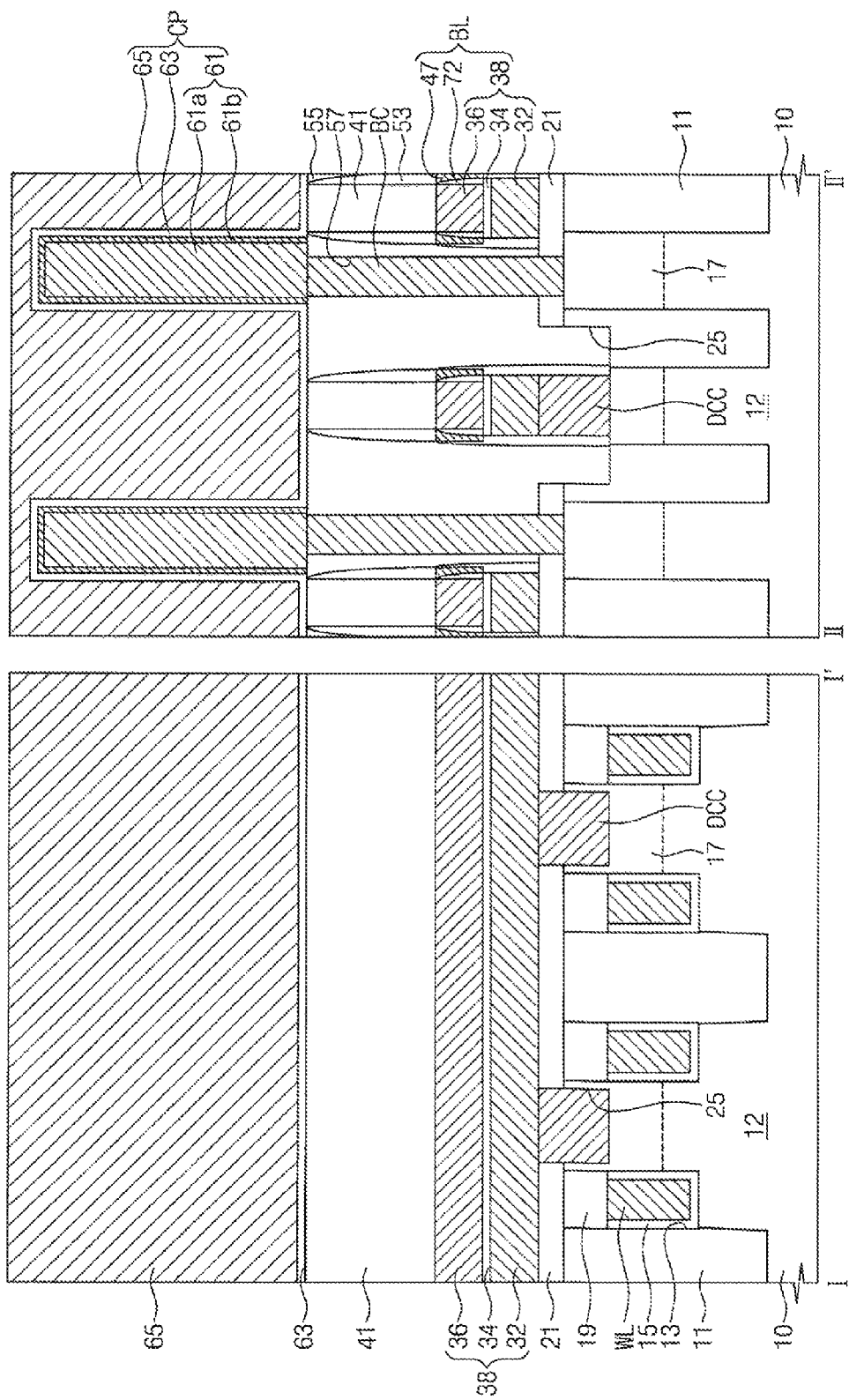
FIG. 3 is a sectional view taken along lines I-I' and II-II' of FIG. 1 to illustrate semiconductor devices according to other example embodiments of the present inventive concepts.

FIG. 3 is a sectional view taken along lines I-I' and II-II' of FIG. 1 to illustrate semiconductor devices according to other example embodiments of the present inventive concepts. For concise description, a previously described element may be identified by a similar or identical reference number without repeating an overlapping description thereof.

Referring to FIG. 3, the bit line pattern 38 may include the first bit line pattern 32, the second bit line pattern 34, and the third bit line pattern 36. The first bit line pattern 32 and the second bit line pattern 34 may have substantially the same width, and the third bit line pattern 36 may have a width smaller than those of the first and second bit line patterns 32 and 34.

Seed patterns 72 may be provided on sidewalls of third bit line patterns 36. A sum in width of the third bit line pattern 36 and two seed patterns 72 may be substantially equal to a width of ones of the first and second bit line patterns 32 and 34. The seed pattern 72 may be formed of or include, for example, titanium nitride (TiN), titanium/titanium nitride (Ti/TiN), titanium silicon nitride (TiSiN), tantalum nitride (TaN), tungsten nitride (WN), tungsten (W), aluminum (Al), copper (Cu), nickel (Ni), cobalt (Co), polysilicon, and/or doped polysilicon. The graphene pattern 47 may be provided on the seed pattern 72. In some embodiments, a bit line BL may include the bit line pattern 38, the seed pattern 72, and the graphene pattern 47.

Figure 4:
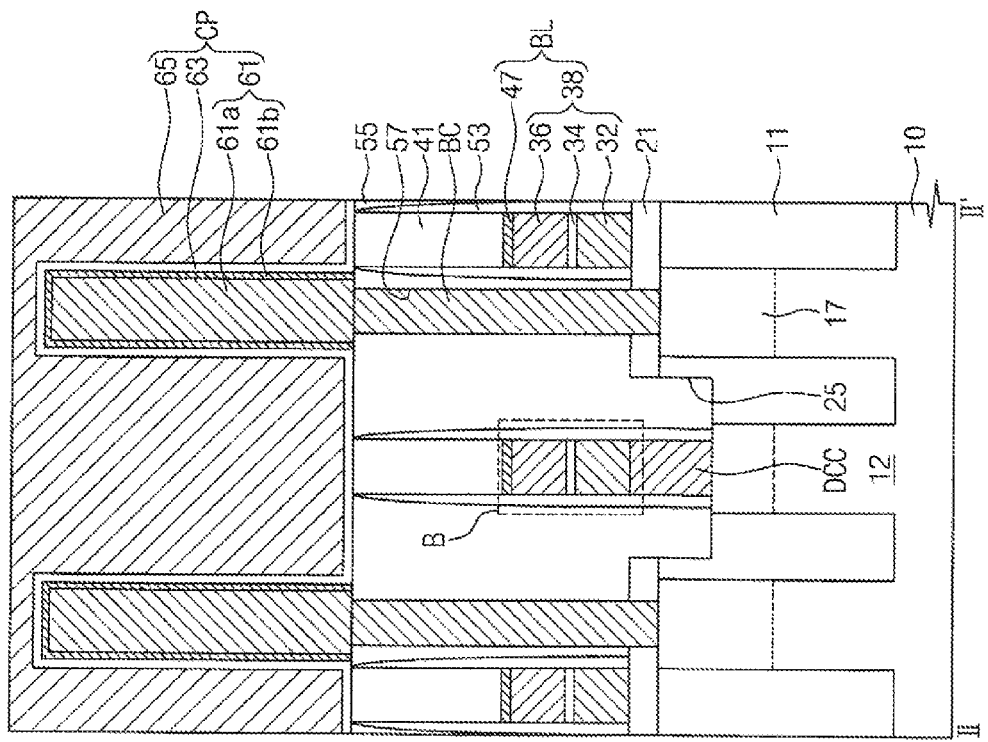
FIG. 4 is a sectional view taken along lines I-I' and II-II' of FIG. 1 to illustrate semiconductor devices according to still other example embodiments of the present inventive concepts.
Figure 4:
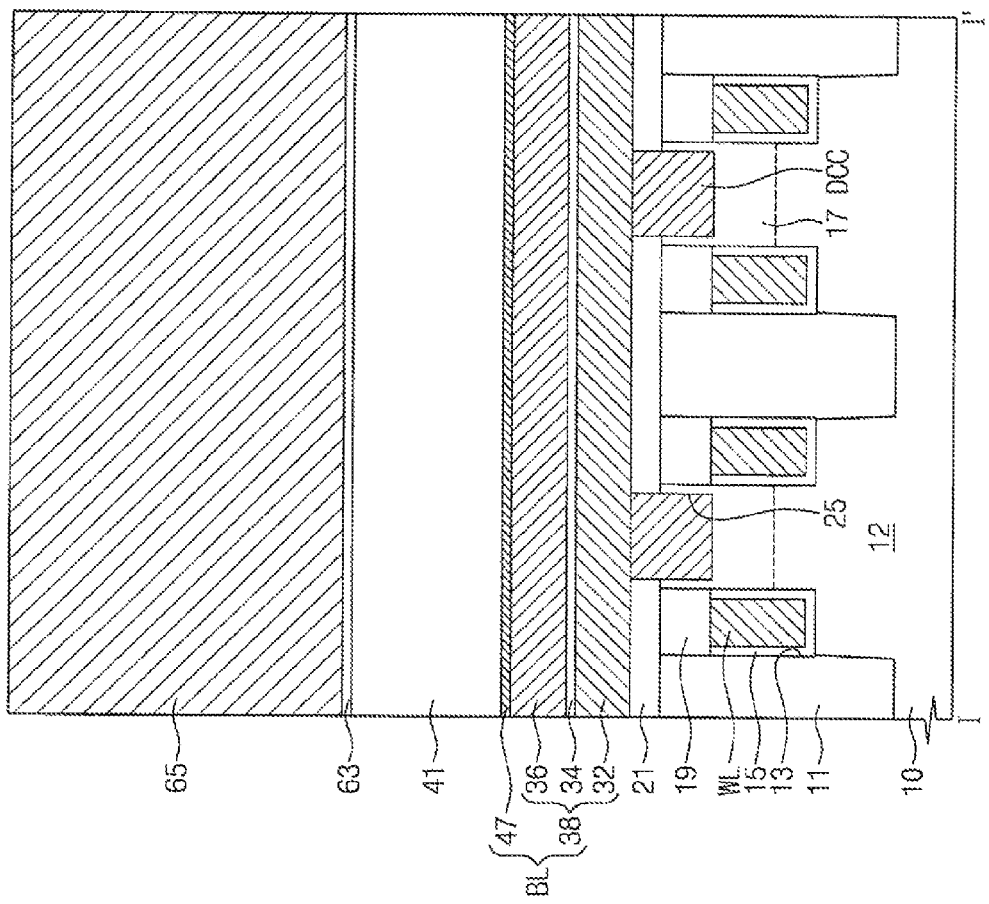

FIG. 4 is a sectional view taken along lines I-I' and II-II' of FIG. 1 to illustrate semiconductor devices according to still other example embodiments of the present inventive concepts. For concise description, a previously described element may be identified by a similar or identical reference number without repeating an overlapping description thereof.

Referring to FIG. 4, the graphene pattern 47 may be provided on a top surface of the third bit line pattern 36. The graphene pattern 47 may have substantially the same width as that of the bit line pattern 38.

Figure 8A:
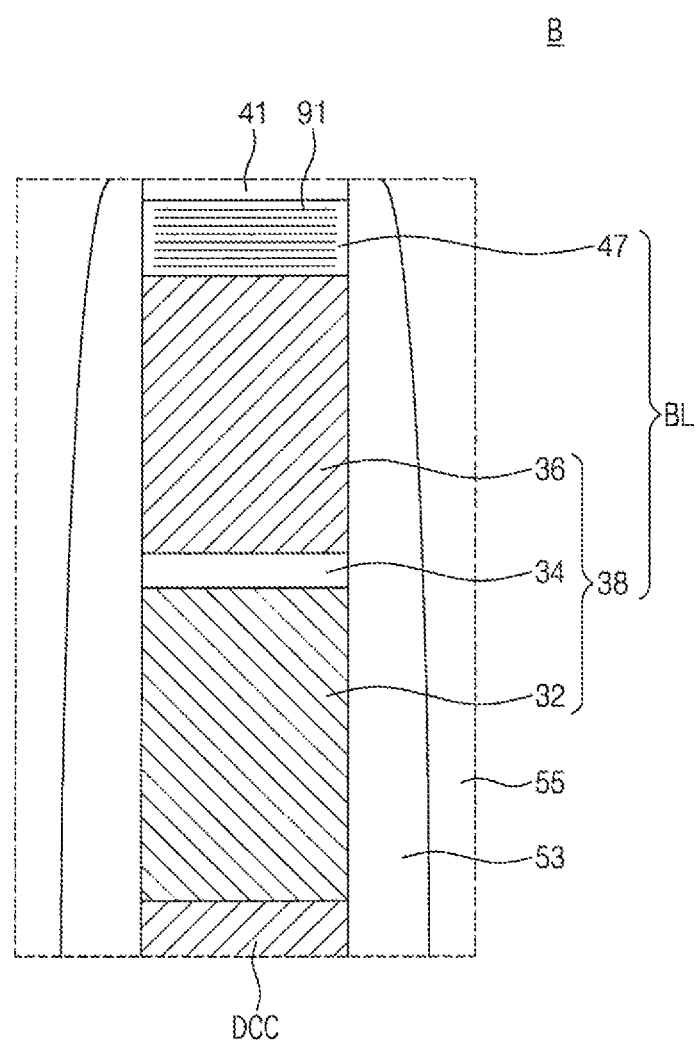
FIG. 8A is an enlarged sectional view illustrating a portion (e.g., the portion B of FIG. 3) of semiconductor devices according to still other example embodiments of the present inventive concepts.
Figure 8B:
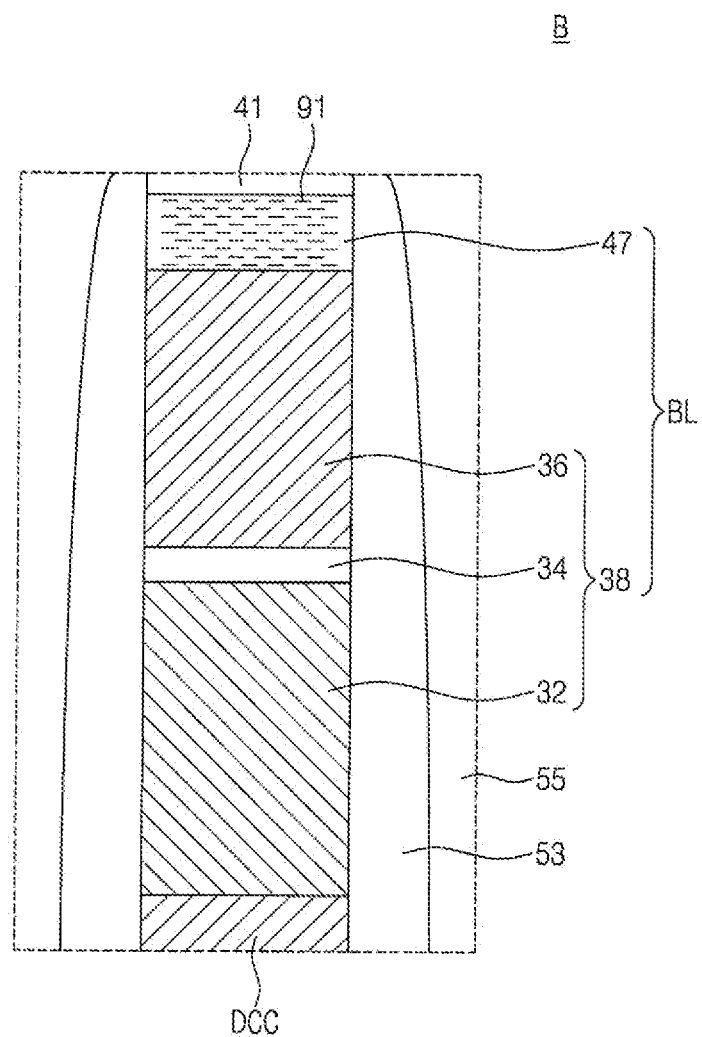
FIG. 8B is an enlarged sectional view illustrating a portion (e.g., the portion B of FIG. 3) of semiconductor devices according to further example embodiments of the present inventive concepts.

As shown in FIG. 8A, the graphene pattern 47 may include a plurality of graphene films 91 stacked parallel to a top surface of a graphene seed layer. As an example, referring to FIG. 8A, the graphene films 91 may be sequentially stacked on a top surface of the third bit line pattern 36, and ones of the graphene films 91 may be a continuous layer that is parallel to the a top surface of the third bit line pattern 36. The graphene pattern 47 may be provided to have a single crystalline structure. In other embodiments, as shown in FIG. 8B, the graphene pattern 47 may include a plurality of graphene films 91 sequentially stacked on the top surface of the third bit line pattern 36. According to the embodiments of FIG. 8B, ones of the graphene films 91 may be a discontinuous layer that is parallel to the top surface of the third bit line pattern 36. The graphene pattern 47 may be provided to have a polycrystalline structure.

Figure 5:
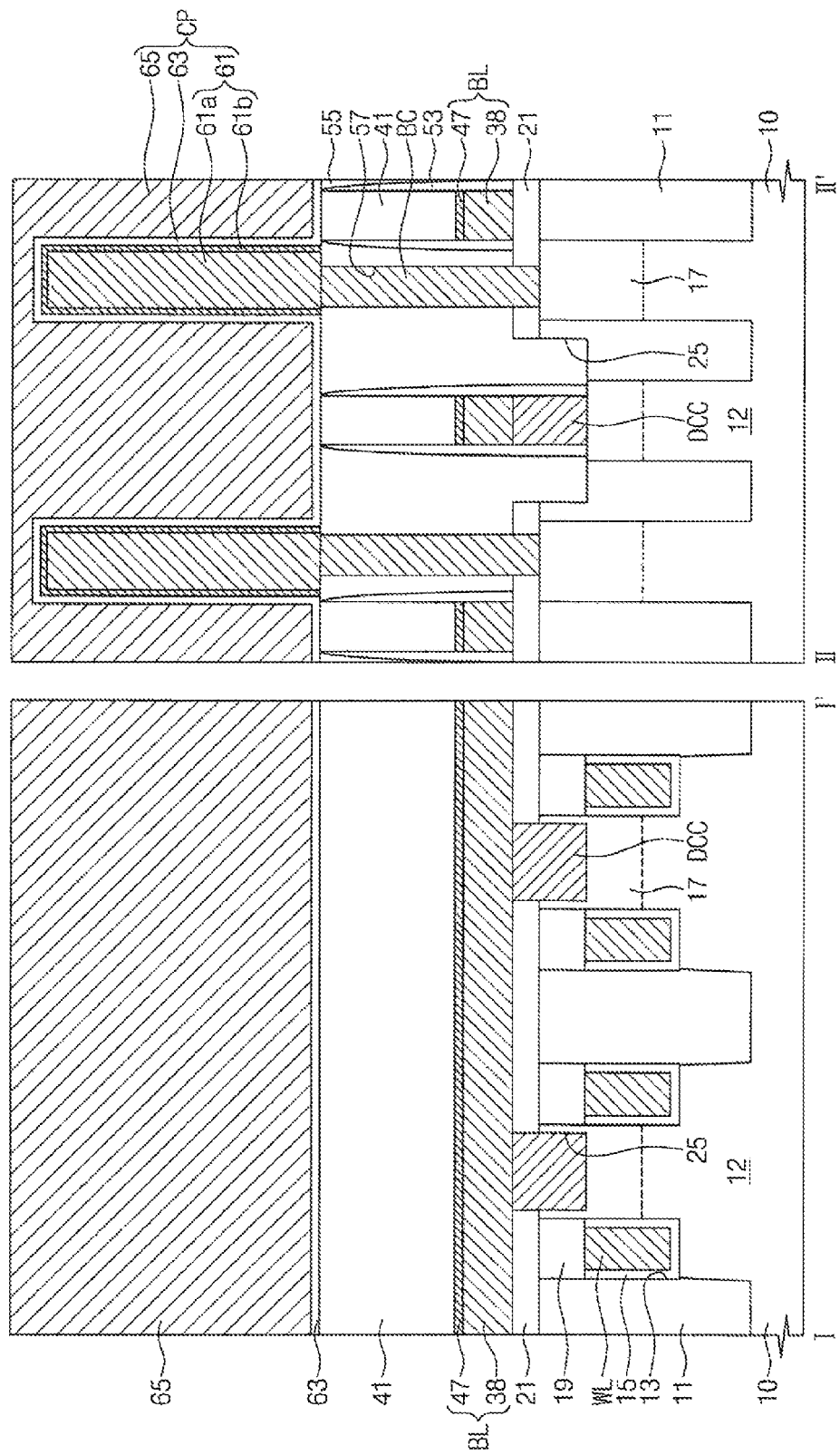
FIG. 5 is a sectional view taken along lines I-I' and II-II' of FIG. 1 to illustrate semiconductor devices according to further example embodiments of the present inventive concepts.

FIG. 5 is a sectional view taken along lines I-I' and II-II' of FIG. 1 to illustrate semiconductor devices according to further example embodiments of the present inventive concepts. For concise description, a previously described element may be identified by a similar or identical reference number without repeating an overlapping description thereof.

Referring to FIG. 5, the bit line pattern 38 may be formed of a single layer. The bit line pattern 38 may include, for example, a polysilicon layer or a doped polysilicon layer. The graphene pattern 47 may be disposed on a top surface of the bit line pattern 38. The graphene pattern 47 may have substantially the same width as that of the bit line pattern 38. The insulating pattern 41 may be provided on the graphene pattern 47.

Figure 6:
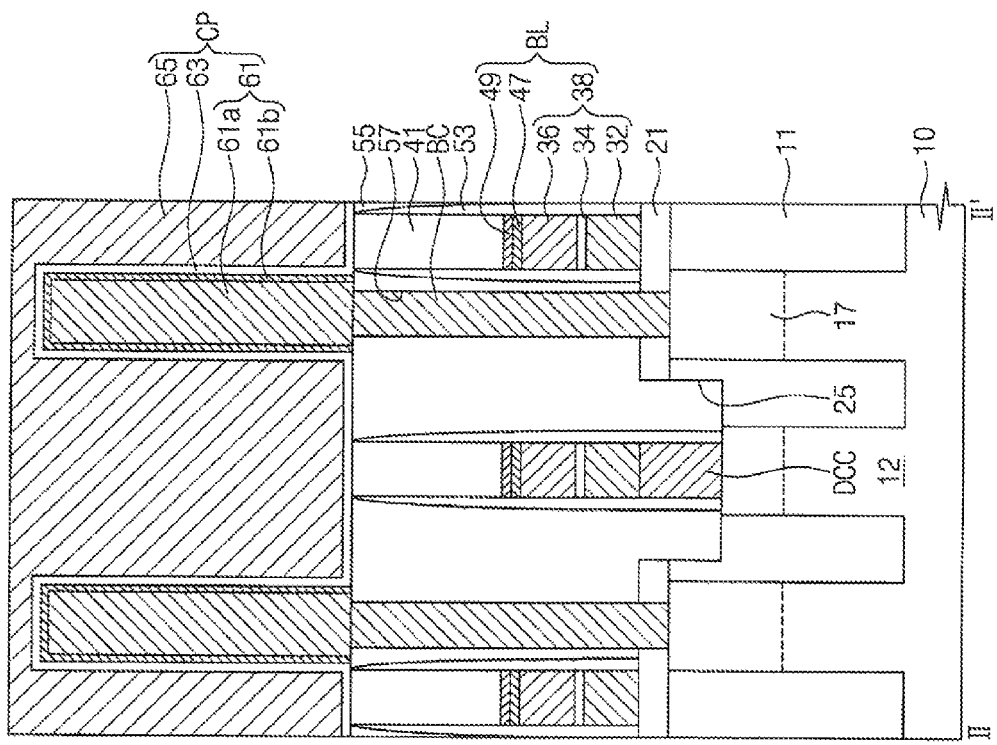
FIG. 6 is a sectional view taken along lines I-I' and II-II' of FIG. 1 to illustrate semiconductor devices according to yet other example embodiments of the present inventive concepts.
Figure 6:
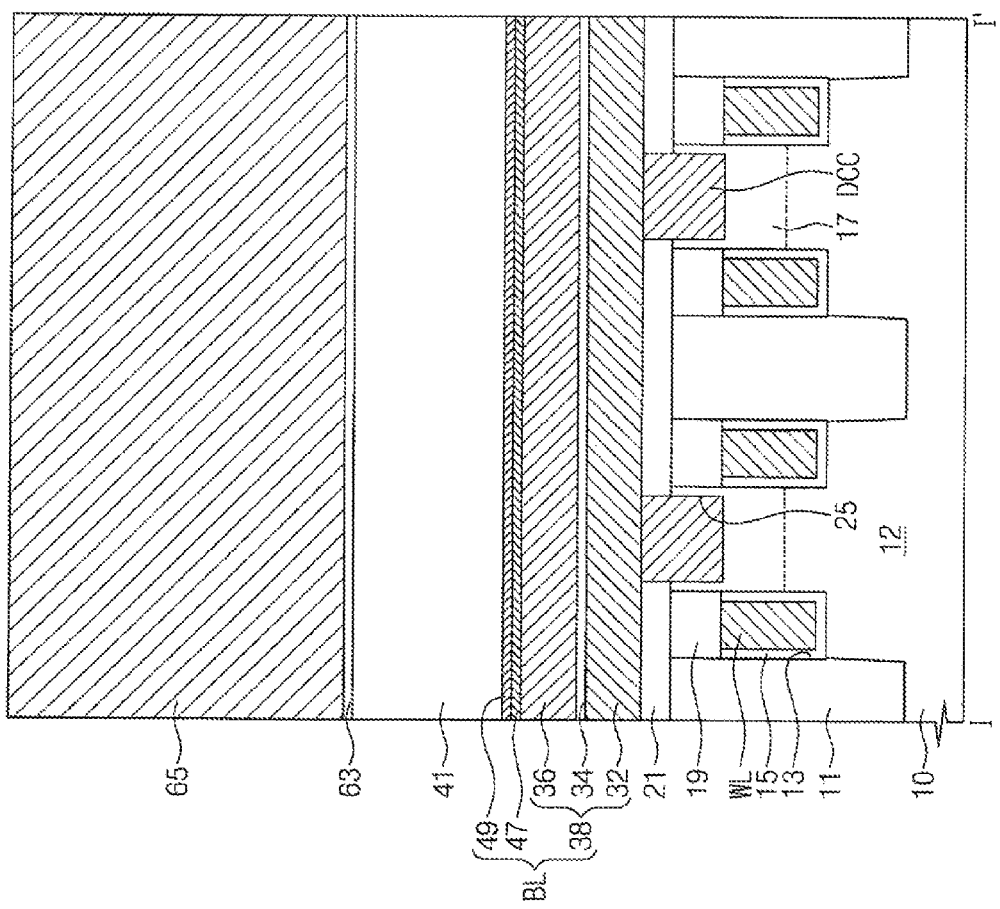

FIG. 6 is a sectional view taken along lines I-I' and II-II' of FIG. 1 to illustrate semiconductor devices according to yet other example embodiments of the present inventive concepts. For concise description, a previously described element may be identified by a similar or identical reference number without repeating an overlapping description thereof.

Referring to FIG. 6, the bit line pattern 38 may include the first bit line pattern 32, the second bit line pattern 34, and the third bit line pattern 36. The graphene pattern 47 may be provided on a top surface of the third bit line pattern 36. A transfer graphene pattern 49 may be provided on a top surface of the graphene pattern 47. The transfer graphene pattern 49 may be formed by growing a graphene layer on another seed layer, separating the grown graphene layer from the seed layer, and transferring the separated graphene layer onto the graphene pattern 47. The transfer graphene pattern 49 may be provided to have a single crystalline structure. As described with reference to FIGS. 7A and 7B, the graphene pattern 47 may be formed to have a single crystalline or polycrystalline structure. In the case where the graphene pattern 47 has a polycrystalline structure, the graphene pattern 47 and the transfer graphene pattern 49 may have different crystal structures from one other. In some embodiments, a bit line BL may include the bit line pattern 38, the graphene pattern 47, and the transfer graphene pattern 49.

FIGS. 9A through 9L are sectional views taken along lines I-I' and II-II' of FIG. 1 to illustrate methods of fabricating semiconductor devices, according to example embodiments of the present inventive concepts.

Referring to FIGS. 1 and 9A, a device isolation layer 11 may be formed on a substrate 10 to define an active region 12. The device isolation layer 11 may be formed by forming isolation trenches in the substrate 10 and filling the trenches with an insulating material. In example embodiments, a plurality of active regions 12 may be formed parallel to one other and the active regions 12, ones of which may be shaped like a bar extending in a third, or z, direction. The substrate 10 may be, for example, a bulk silicon wafer, a silicon-on-insulator (SOI) wafer, a germanium substrate, a germanium-on-insulator (GOI) wafer, a silicon-germanium wafer, and/or a substrate including an epitaxial layer formed by a selective epitaxial growth (SEG) process. The device isolation layer 11 may be formed of or include, for example, a silicon oxide layer, a silicon nitride layer, or a silicon oxynitride layer.

Source/drain regions 17 may be formed in ones of the active regions 12. For example, the formation of the source/drain regions 17 may include forming an ion injection mask on the substrate 10 and performing an ion implantation process using the ion injection mask.

Trenches 13 may be formed in the substrate 10. For example, a pair of trenches 13 extending in a first, or x, direction may be formed in ones of the active regions 12. The trenches 13 may be arranged along a second, or y, direction, which may be perpendicular to the first, or x, direction. A gate insulating layer 15 may be formed to conformally cover the trenches 13. Thereafter, word lines WL may be formed on the gate insulating layer 15 to fill portions of the trenches 13. In some embodiments, the word lines WL may completely fill the trenches 13. The gate insulating layer 15 may be formed of an insulating material (e.g., an oxide layer formed by a thermal oxidation process). The word lines WL may be formed of a conductive material (e.g., polysilicon, doped polysilicon, metallic materials, and/or metal silicides, among others).

The gate insulating layer 15 and the word lines WL may be partially removed (for example, from upper portions of the trenches 13), and buffer insulating patterns 19 may be formed to fill the upper portions of the trenches 13. The buffer insulating patterns 19 may be formed to fill portions of the trenches 13 provided with the word lines WL. In some embodiments, the buffer insulating patterns 19 may be formed to completely fill the trenches 13 provided with the word lines WL. The buffer insulating patterns 19 may be formed of or include, for example, silicon oxide, silicon nitride, and/or silicon oxynitride.

Figure 9B:
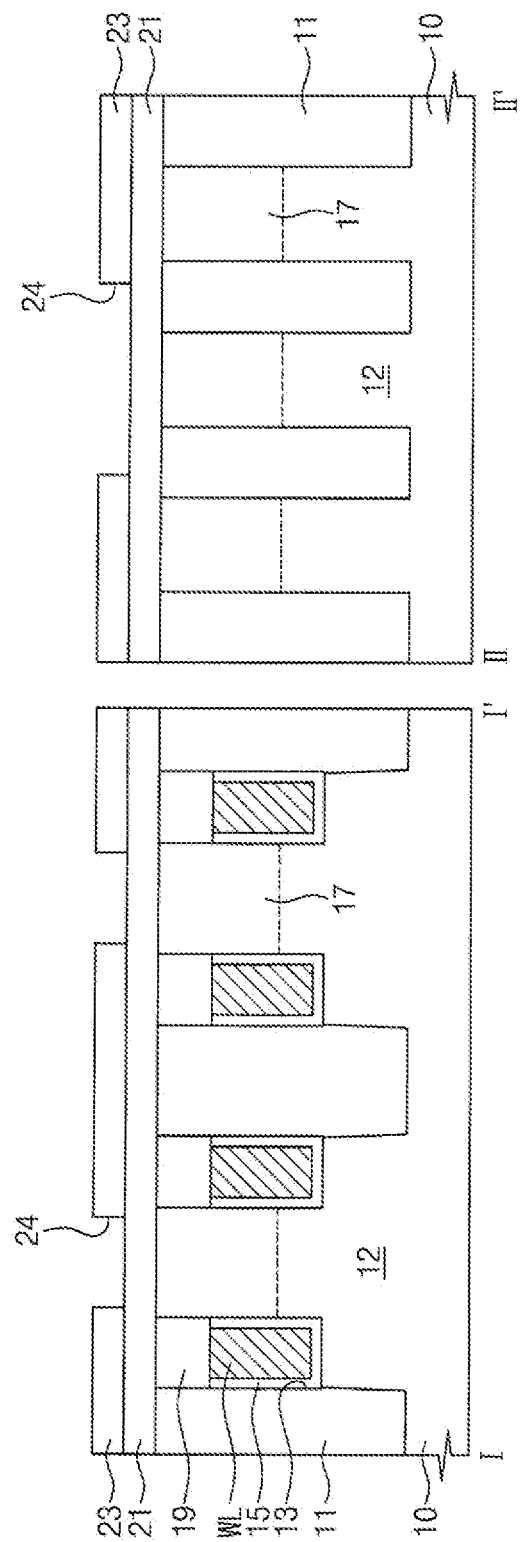

Referring to FIGS. 1 and 9B, a first interlayered insulating layer 21 may be formed on the substrate 10. The first interlayered insulating layer 21 may include an insulating layer. For example, the first interlayered insulating layer 21 may be formed of a silicon oxide layer, a silicon nitride layer, and/or a silicon oxynitride layer. The first interlayered insulating layer 21 may be a multi-layered structure. In some embodiments, the first interlayered insulating layer 21 may include at least two layers. In further embodiments of the present inventive concepts, ones of the layers of the first interlayered insulating layer 21 may be formed of materials different from other ones of the layers of the first interlayered insulating layer 21. A first mask 23 may be formed on the first interlayered insulating layer 21. The first mask 23 may be formed to have an opening 24. For example, the opening 24 may overlap a portion of the active region 12 positioned between the word lines WL, when viewed in a plan view. The first mask 23 may include, for example, a silicon nitride layer.

Figure 9C:
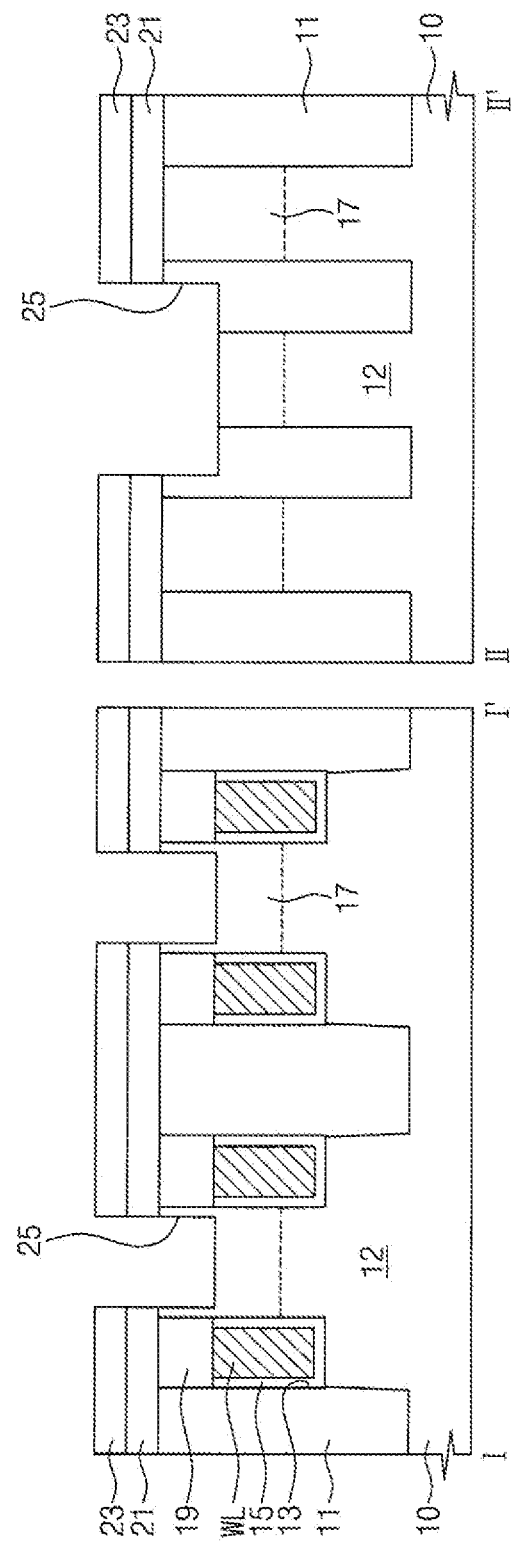

Referring to FIGS. 1 and 9C, an etching process using the first mask 23 with the opening 24 may be performed to etch the first interlayered insulating layer 21 and the substrate 10. Accordingly, bit line node contact holes 25 (hereinafter, contact holes) may be formed in the substrate 10. In some embodiments, a contact hole 25 may be formed to expose one of the source/drain regions 17 between an adjacent pair of the word lines WL, and moreover, partially etch an upper portions the device isolation layer 11 adjacent to the source/drain region 17. In certain embodiments of the present inventive concepts, the contact hole 25 may be formed in such a way that there is no difference between widths measured in the first (or x) and second (or y) directions.

Figure 9D:
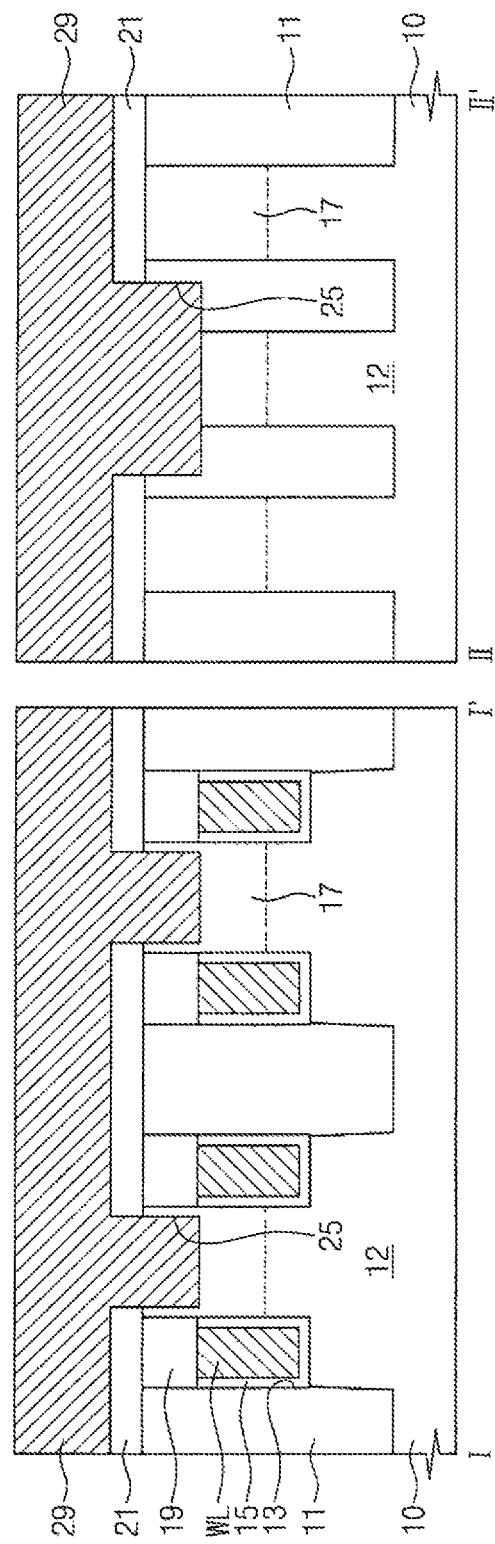

Referring to FIGS. 9D and 9E, a contact layer 29 may be formed on the first interlayered insulating layer 21. The contact layer 29 may be formed to fill portions of the contact holes 25. The contact layer 29 may be etched, for example, using a planarization process, until a top surface of the first interlayered insulating layer 21 is exposed, and thus, bit line node contacts DCC (hereinafter, BL contacts) may be formed in the contact holes 25. The BL contacts DCC may include, for example, metal silicides, polysilicides, metal nitrides, and/or metals.

Figure 9F:
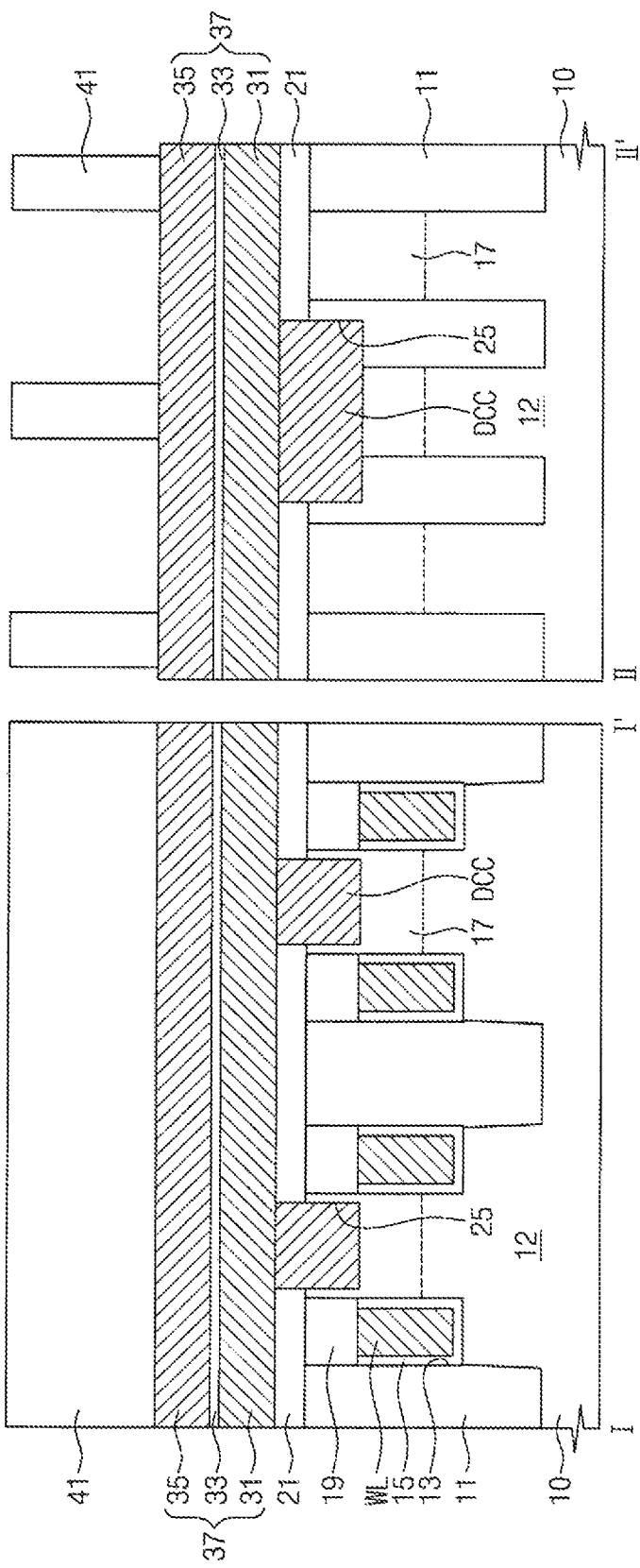

Referring to FIGS. 1 and 9F, an electrode layer 37 may be formed on the first interlayered insulating layer 21 provided with the BL contacts DCC. As an example, the electrode layer 37 may include a plurality of conductive layers. For example, the electrode layer 37 may include a first electrode layer 31, a second electrode layer 33, and a third electrode layer 35 sequentially stacked on the first interlayered insulating layer 21. For example, the first electrode layer 31 may include polysilicon and/or doped polysilicon, the second electrode layer 33 may include diffusion barrier metal materials (e.g., TiN, Ti/TiN, TiSiN, TaN, and/or WN), and the third electrode layer 35 may include tungsten (W), aluminum (Al), copper (Cu), nickel (Ni), and/or cobalt (Co). In example embodiments of the present inventive concepts, the first electrode layer 31 may be formed of a polysilicon layer, the second electrode layer 33 may be formed of a TiN layer, and the third electrode layer 35 may be formed of a tungsten layer.

A plurality of insulating patterns 41 may be formed on the electrode layer 37. The insulating patterns 41 may extend parallel to each other or in the second, or y, direction, and they may be arranged along the first, or x, direction. In example embodiments of the present inventive concepts, ones of the insulating patterns 41 may be formed to cross the active regions 12, which are arranged along the second, or y, direction, or the BL contacts DCC thereof. The insulating patterns 41 may include, for example, a silicon oxide layer and/or a silicon nitride layer.

Figure 9G:
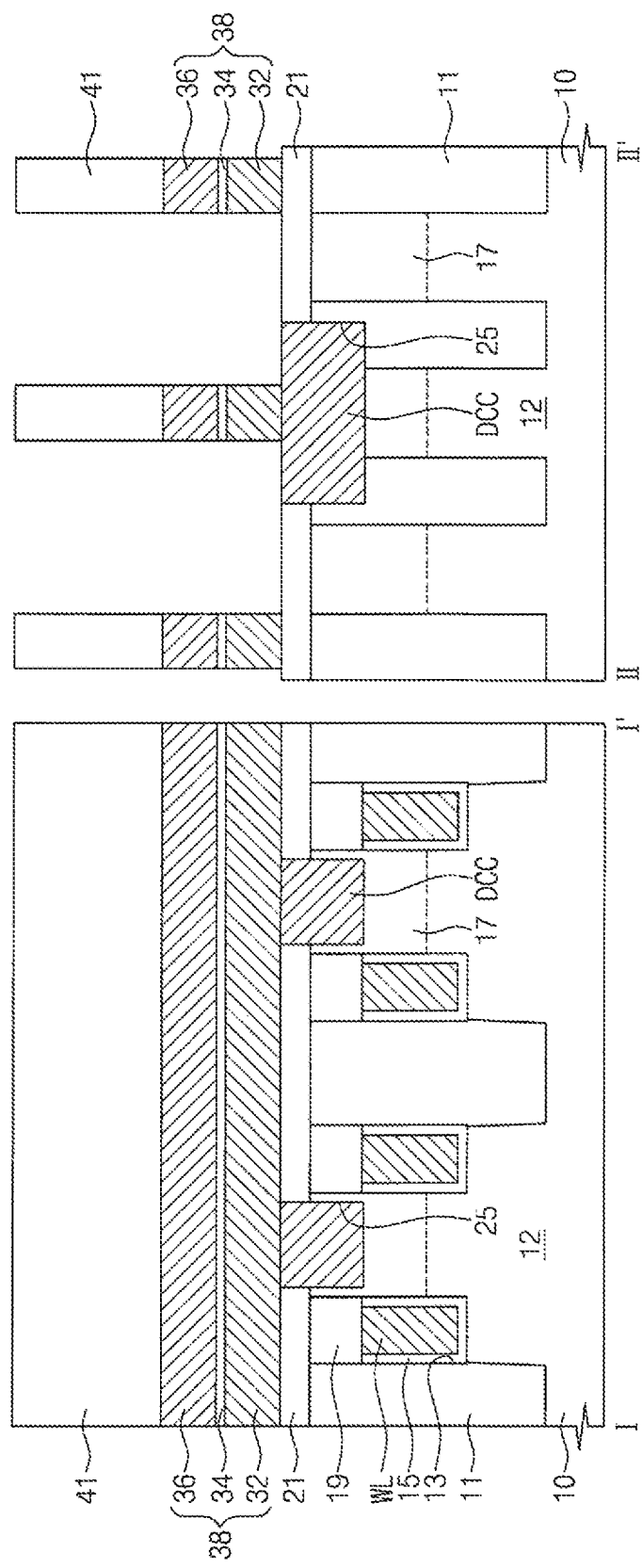

Referring to FIGS. 1 and 9G, the electrode layer 37 may be etched using the insulating patterns 41 as an etch mask to form bit line patterns 38 below the insulating patterns 41. In the case where the electrode layer 37 is formed of a plurality of conductive layers, ones of the bit line patterns 38 may include a first bit line pattern 32, a second bit line pattern 34, and a third bit line pattern 36 sequentially stacked on the substrate 10. The bit line patterns 38 may be arranged in the first, or x, direction, and ones of the bit line patterns 38 may be formed to connect the BL contacts DCC, which are arranged along the second, or y, direction. In certain embodiments, the bit line patterns 38 may be formed to partially expose the top surfaces of the first interlayered insulating layer 21 and the BL contacts DCC.

Figure 9H:
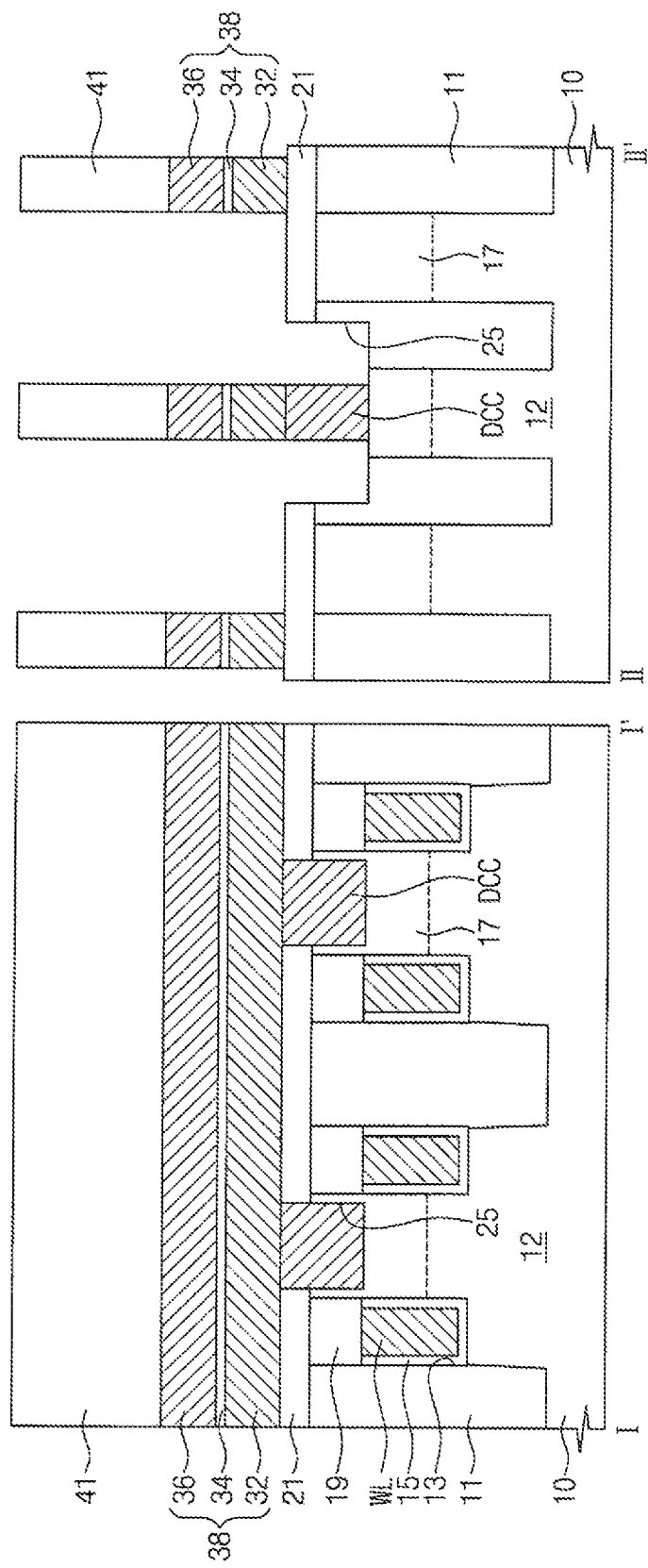

Referring to FIG. 9H, the exposed portion of the BL contact DCC may be etched by using the insulating patterns 41 and/or the bit line patterns 38 as an etch mask, and thus, the BL contacts DCC may be located within regions under the bit line patterns 38. In other embodiments, the localization of the BL contacts DCC may be performed using the process of etching the electrode layer 37. In other words, ones of the BL contacts DCC may be formed to have substantially the same width as a corresponding one of the bit line patterns 38. The BL contact DCC may also be formed in such a way that a top surface thereof has substantially the same width as that of the bit line pattern 38 and is narrower than a bottom surface thereof.

Figure 9I:
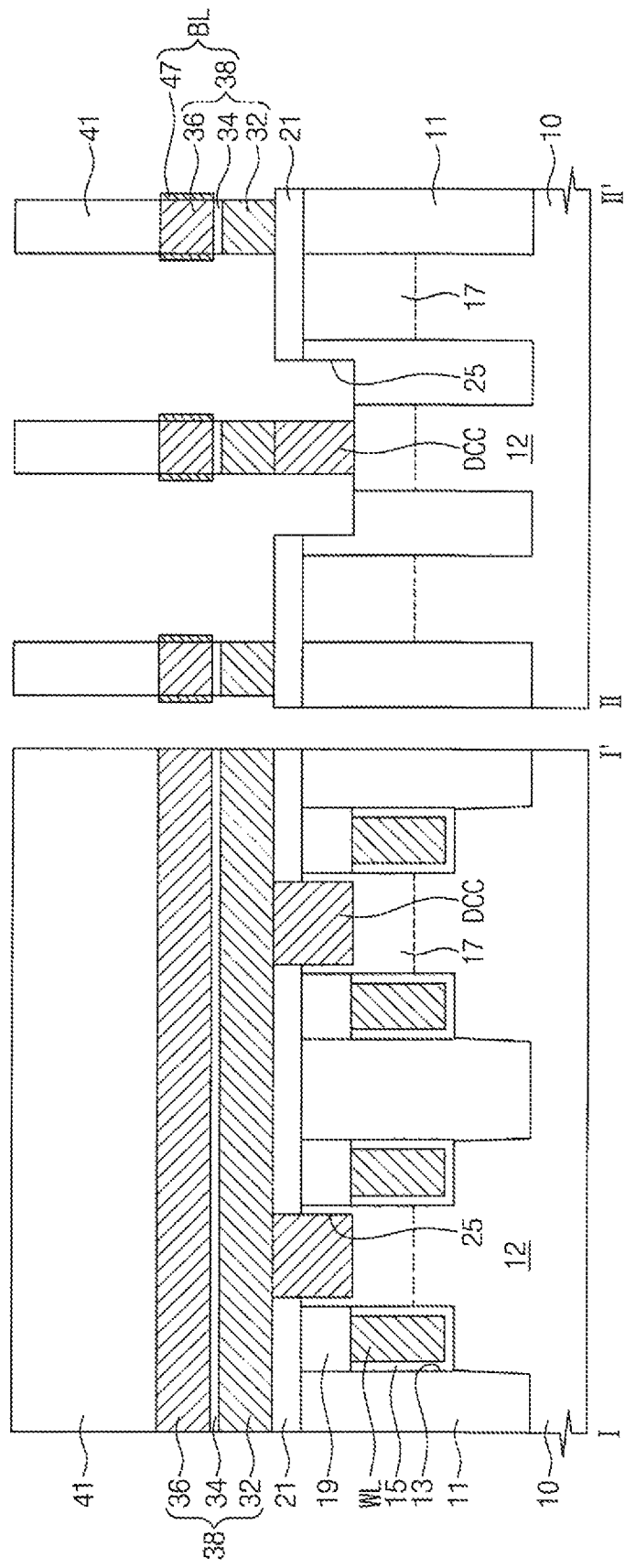

Referring to FIG. 9I, graphene patterns 47 may be formed on sidewalls of the third bit line patterns 36. In the case where process conditions (e.g., temperature, source material, or power) are changed, the graphene electrodes 47 may be formed on other patterns. For example, the graphene electrodes 47 may be formed on sidewalls of the first to third bit line patterns 32, 34, and 36.

The formation of the graphene patterns 47 may include supplying a hydrogen gas to couple hydrogen atoms on the sidewall of the third bit line pattern 36, supplying a carbon-containing reaction gas (e.g., $CH_4$, $C_2H_2$, or a mixture thereof) to replace the hydrogen atoms with carbon atoms, and growing a carbon layer. The graphene patterns 47 may be formed by growing carbon atoms using, for example, an inductively-coupled plasma chemical vapor deposition (ICP-CVD) at about 700° C.

Referring to FIG. 7A, the graphene patterns 47 may include a portion of graphene films 91, ones of which are formed to cover the sidewall of the third bit line pattern 36 in a substantially continuous and parallel manner. For example, the graphene patterns 47 may be formed to have a single crystalline structure. Referring to FIG. 7B, the graphene patterns 47 may include a plurality of graphene films 91 ones of which are formed to cover the sidewall of the third bit line pattern 36 in a substantially discontinuous and parallel manner. For example, the graphene patterns 47 may be formed to have a polycrystalline structure. The bit line patterns 38 and the graphene patterns 47 may serve as bit lines BL.

As an integration density of a semiconductor device increases, electrodes constituting the semiconductor device may be formed to have a reduced width and a reduced thickness. This can lead to an increase in resistivity of the electrodes and a deterioration in electrical characteristics of the semiconductor device. Meanwhile, the graphene can be usually formed on a seed layer containing a transition metal (e.g., copper (Cu) and nickel (Ni)). In other words, a few metallic materials can be limitedly used as the seed layer for growing the graphene. Moreover, the graphene can be formed by performing a deposition process at high temperature of 1000° C. or higher. Accordingly, it can be difficult to form the graphene on a desired electrode layer, in a fabrication process of a semiconductor device.

According to example embodiments of the present inventive concepts, by using the method described herein, it may be possible to form the graphene patterns on various conductive materials. For example, the graphene patterns may be directly formed on electrodes of semiconductor devices, without steps of growing graphene on a seed layer and transferring the graphene to the electrode. In addition, the graphene pattern can be formed by a deposition process performed at a temperature of about 700° C. This makes it possible to form the graphene pattern in semiconductor fabrication processes. In addition, even in the case of reducing a thickness or a width of the electrode, it may be possible to maintain electrical characteristics of the electrode, because resistivity of the graphene is lower than that of copper.

Figure 9J:
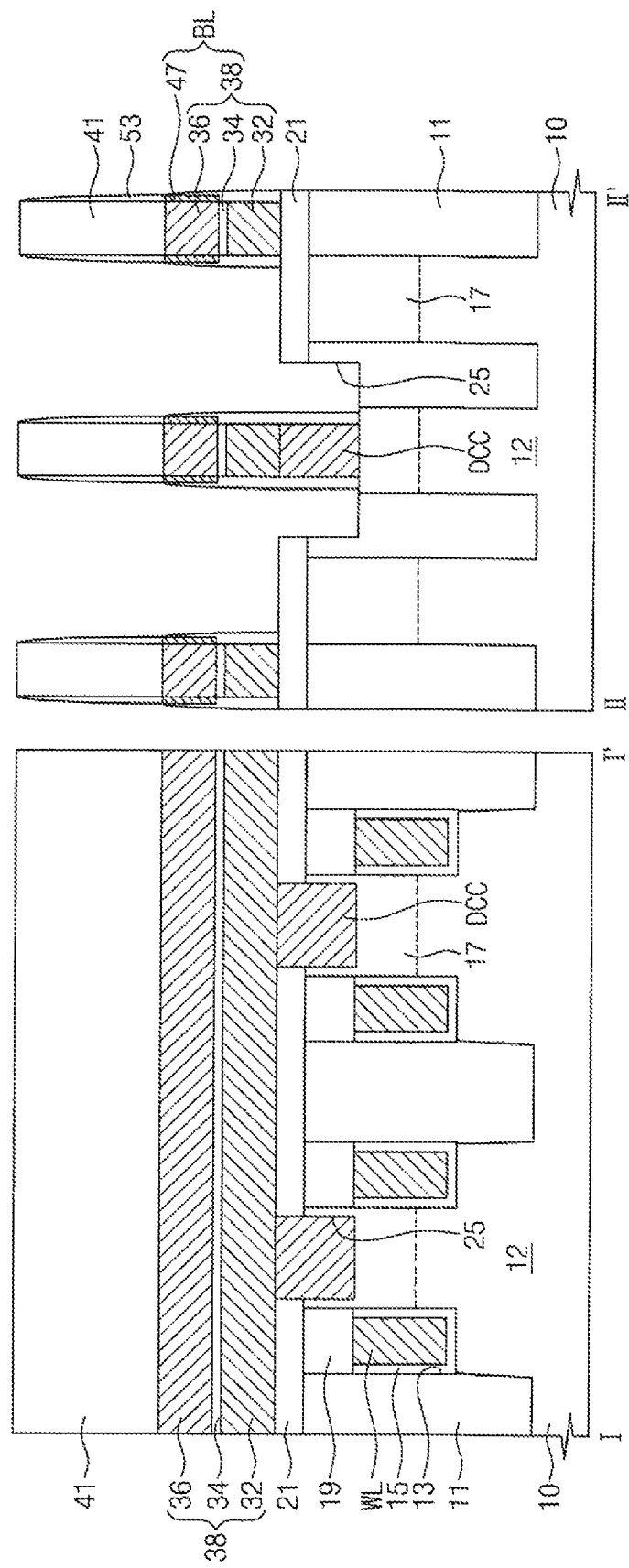

Referring to FIG. 9J, second spacers 53 may be formed on sidewalls of the bit lines BL and the insulating patterns 41. The second spacers 53 may extend to cover sidewalls of the BL contact DCC. For example, the second spacers 53 may be formed by forming an insulating layer to conformally cover the resulting structure provided with the graphene patterns 47 and performing an etch-back process on the insulating layer. The second spacers 53 may be formed of or include, for example, a silicon oxide layer or a silicon nitride layer.

Figure 9K:
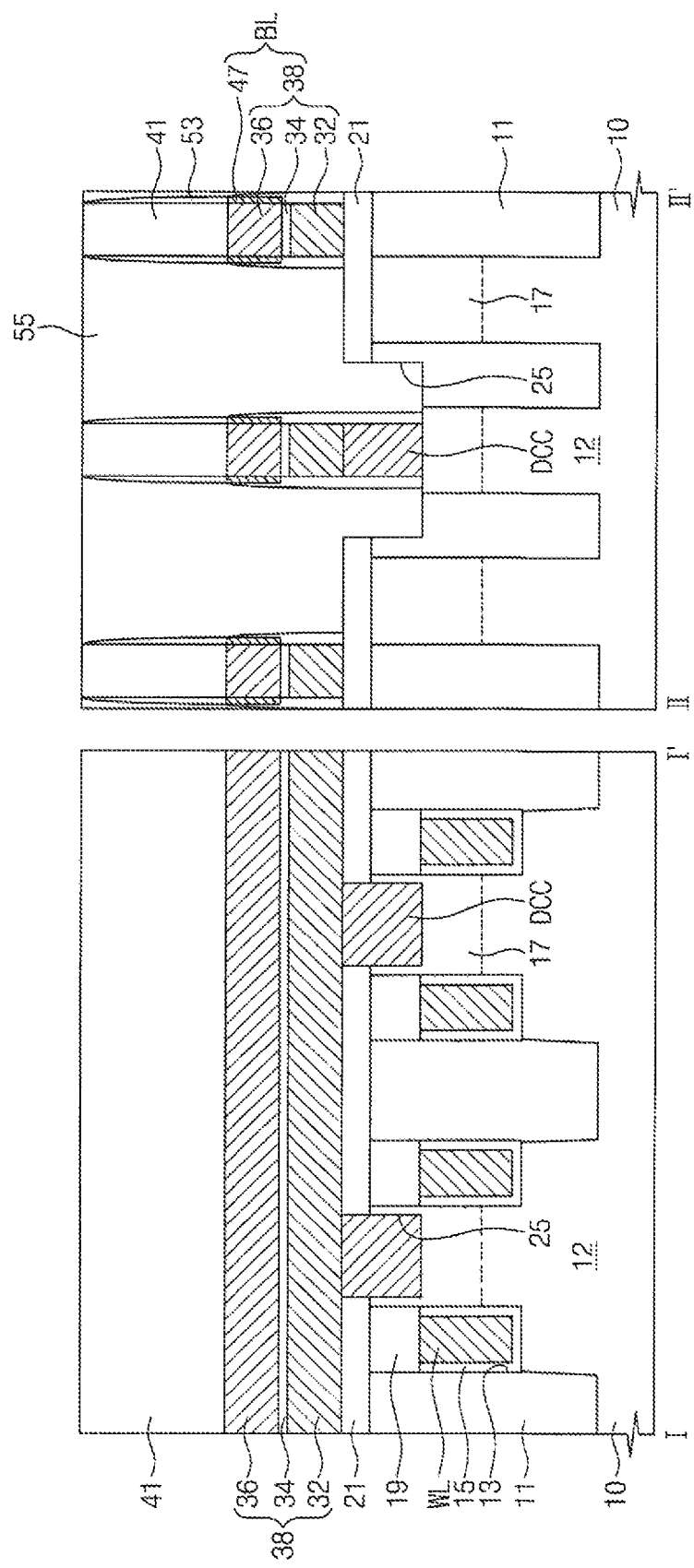

Referring to FIG. 9K, a second interlayered insulating layer 55 may be formed on the resulting structure provided with the second spacers 53. A planarization process may be performed on the second interlayered insulating layer 55 to expose top surfaces of the insulating patterns 41. The second interlayered insulating layer 55 may be formed to fill portions of the contact holes 25. In some embodiments, the second interlayered insulating layer 55 may be formed to completely fill the contact holes 25. In example embodiments of the present inventive concepts, the second interlayered insulating layer 55 may be formed of the same material as the first interlayered insulating layer 21.

Figure 9L:
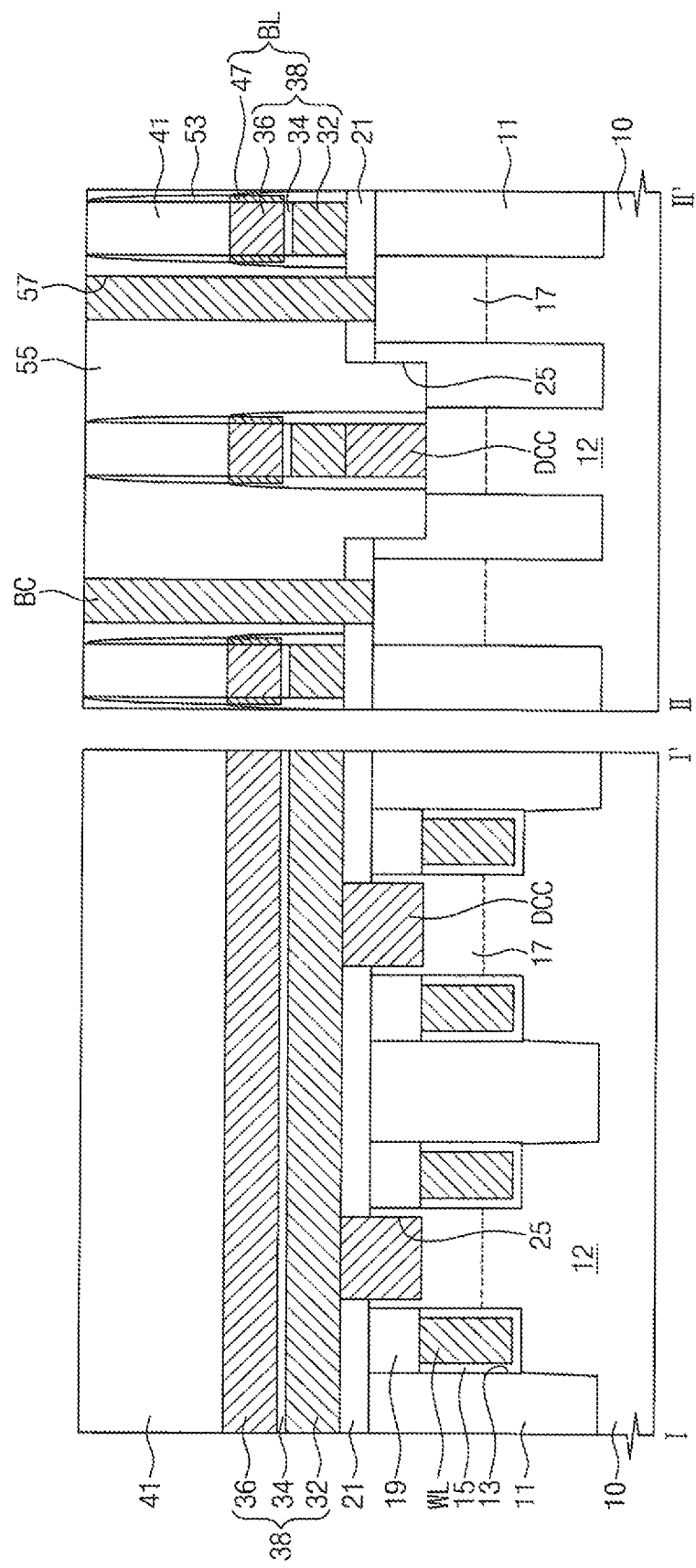

Referring to FIG. 9L, through holes 57 may be formed to expose the source/drain regions 17 through the first and second interlayered insulating layers 21 and 55. Then, storage node contacts BC (hereinafter, storage contacts) may be formed in the through holes 57, respectively. The storage contacts BC may be formed of or include, for example, metal silicides, polysilicon, metal nitrides, and/or metals.

Referring to FIG. 2, capacitors CP may be formed on the storage contacts BC, respectively. In some embodiments, a capacitor CP may include a lower electrode 61, a dielectric layer 63, and an upper electrode 65.

Ones of the lower electrodes 61 may be electrically connected to a corresponding one of the storage contacts BC. Ones of the lower electrodes 61 may include a first lower electrode 61a and a second lower electrode 61b. For example, the first lower electrode 61a may be formed by forming a sacrificial layer with holes on the second interlayered insulating layer 55 and filling the holes with a conductive material. The first lower electrode 61a may include, for example, titanium nitride (TiN), titanium/titanium nitride (Ti/TiN), titanium silicon nitride (TiSiN), tantalum nitride (TaN), tungsten nitride (WN), tungsten (W), aluminum (Al), copper (Cu), nickel (Ni), cobalt (Co), polysilicon, and/or doped polysilicon. After the removal of the sacrificial layer, the second lower electrodes 61b may be formed on surfaces of the first lower electrodes 61a. The second lower electrodes 61b may include graphene. For example, the second lower electrodes 61b may be formed using substantially the same method as that for the graphene pattern 47 previously described above. The second lower electrode 61b may include a plurality of graphene films (e.g., 91 of FIG. 7A), that are formed to cover the surface of the first lower electrode 61a in a substantially continuous and parallel manner. For example, the second lower electrode 61b may be formed to have a single-crystalline structure. In other example embodiments, the second lower electrode 61b may include a plurality of graphene films (e.g., 91 of FIG. 7B), that are formed to cover the surface of the first lower electrode 61a in a substantially discontinuous and parallel manner. For example, the second lower electrodes 61b may be formed to have a poly-crystalline structure.

The dielectric layer 63 may be formed on the second interlayered insulating layer 55 to conformally cover exposed surfaces of the second interlayered insulating layer 55 and the lower electrodes 61. The upper electrode 65 may be formed on the second interlayered insulating layer 55 to cover the dielectric layer 63.

The dielectric layer 63 and the upper electrode 65 may be formed by a layer-forming process (e.g., chemical vapor deposition (CVD), or atomic layer deposition (ALD)) having a good step coverage property.

The dielectric layer 63 may be formed of metal oxides (e.g., $HfO_2$, $ZrO_2$, $Al_2O_3$, $La_2O_3$, $Ta_2O_3$, and/or $TiO_2$, among others) and/or perovskite dielectric materials (e.g., STO (Sr-$TiO_3$), BST ((Ba,Sr)$TiO_3$), Ba$TiO_3$, PZT, and/or PLZT, among others). The dielectric layer 63 may be formed to have a thickness of about 50-150 Å.

The upper electrode 65 may include, for example, doped silicon, metal materials, metal nitrides, and/or metal silicides. As an example, the upper electrode 65 may be formed of refractory metals (e.g., cobalt, titanium, nickel, tungsten, and/or molybdenum, among others). As another example, the upper electrode 65 may be formed of metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and/or tungsten nitride (WN), among others). As still another example, the upper electrode 65 may be formed of noble metals (e.g., platinum (Pt), ruthenium (Ru), and/or iridium (Ir), among others). As a further example, the upper electrode 65 may be formed of precious metal conductive oxides (e.g., PtO, $RuO_2$, and/or $IrO_2$, among others) and/or conductive oxides (e.g., SRO ($SrRuO_3$), BSRO (($Ba,Sr$) $RuO_3$), CRO $CaRuO_3$, and/or LSCo, among others). After the formation of the upper electrode 65, a plasma treatment process and a thermal treatment process may be performed to remove impurities, which may be produced when an upper conductive layer is deposited. Plasma of $N_2$ and $H_2$ gas may be used in the plasma treatment process.

The described methods of the present inventive concepts for forming the graphene pattern 47 are not limited to this example; rather, they can be applied to realize various memory devices (e.g., a FLASH memory device), logic devices, or interconnection and electrode structures thereof.

FIG. 3 is a sectional view taken along lines I-I' and II-II' of FIG. 1 to illustrate semiconductor devices according to other example embodiments of the present inventive concepts. FIGS. 10A through 10G are sectional views taken along lines I-I' and II-II' of FIG. 1 to illustrate methods of fabricating semiconductor devices, according to other example embodiments of the present inventive concepts. For concise description, a previously described element or step may be identified by a similar or identical reference number without repeating an overlapping description thereof.

Figure 10A:
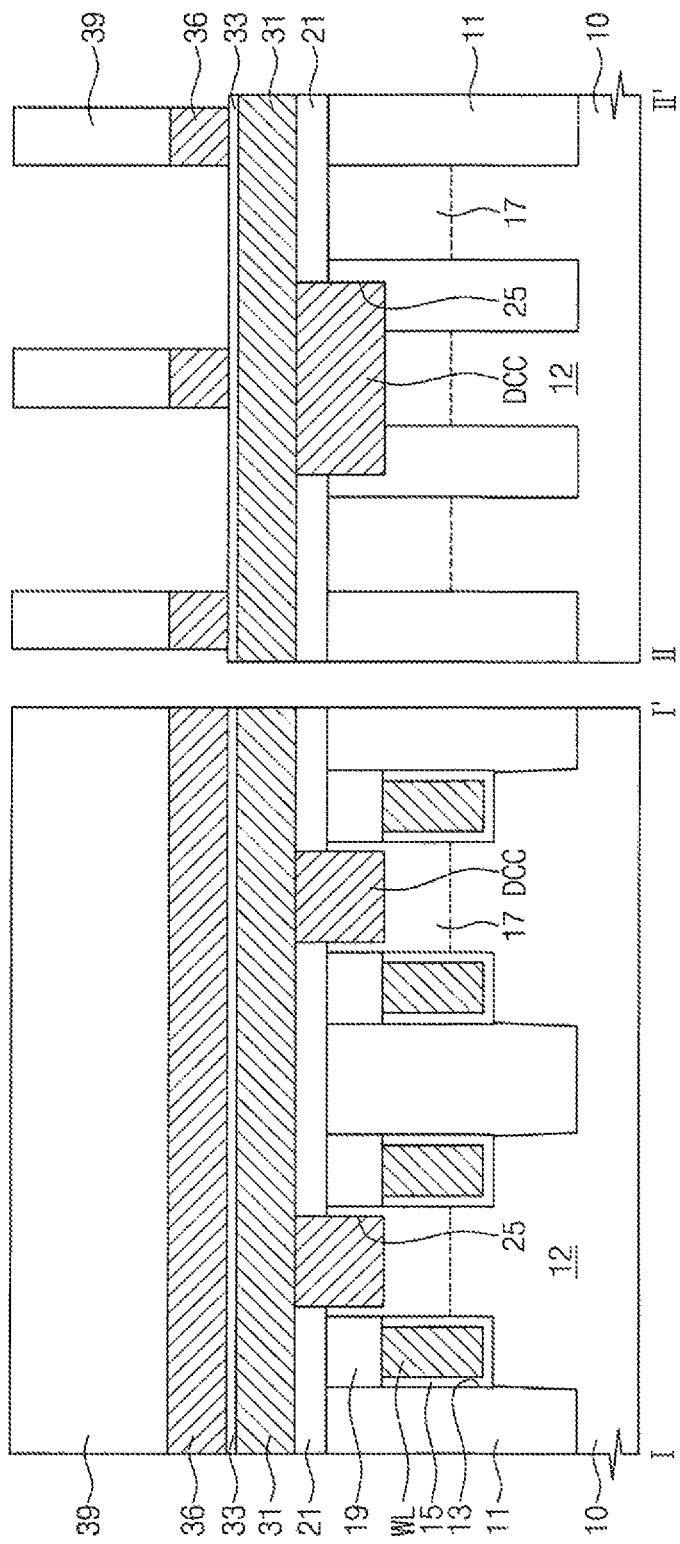
FIGS. 10A through 10G are sectional views taken along lines I-I' and II-II' of FIG. 1 to illustrate methods of fabricating semiconductor devices, according to other example embodiments of the present inventive concepts.

Referring to FIG. 10A, in conjunction with FIG. 9F, the second electrode layer 33 exposed by second masks 39 may be etched to form the third bit line patterns 36. The second masks 39 may extend in the second, or y, direction and may be arranged in the first, or x, direction. In example embodiments of the present inventive concepts, ones of the second masks 39 may be formed to cross the active regions 12, which are arranged along the second, or y, direction, or the BL contacts DCC thereof.

Figure 10B:
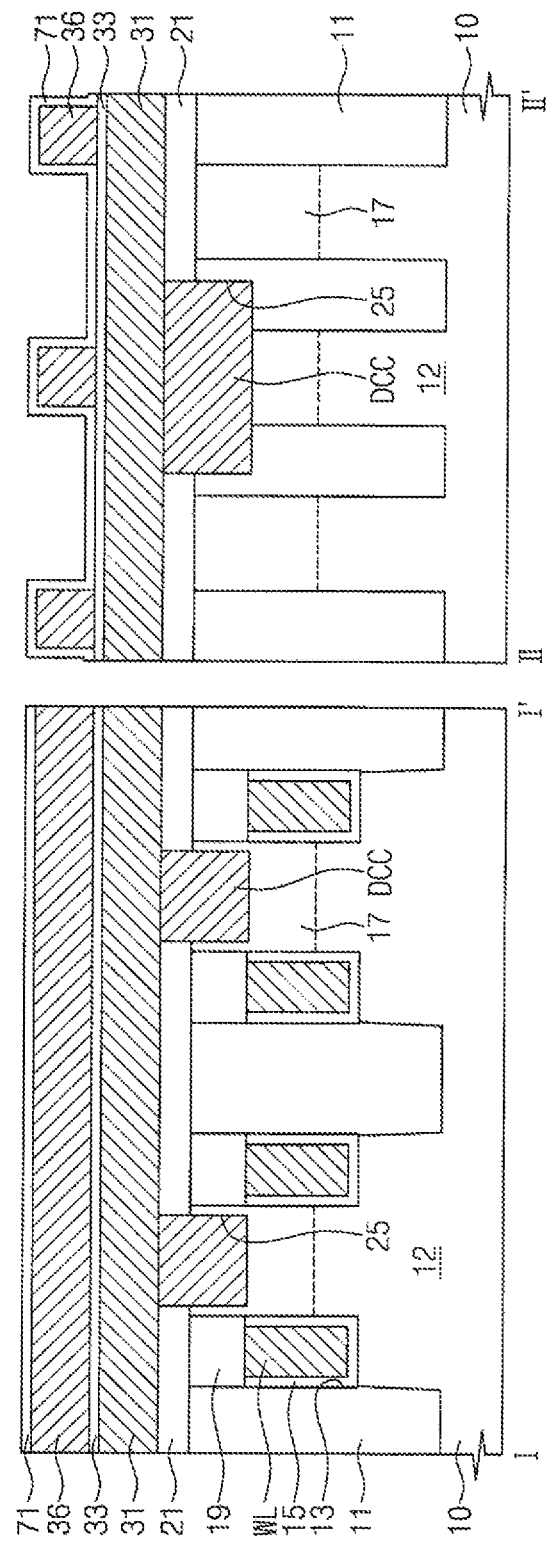

Referring to FIG. 10B, the second masks 39 may be removed, and then a seed layer 71 may be formed to conformally cover the second electrode layer 33 and the third bit line pattern 36. The seed layer 71 may be formed of or include, for example, titanium nitride (TIN), titanium/titanium nitride (Ti/TiN), titanium silicon nitride (TiSiN), tantalum nitride (TaN), tungsten nitride (WN), tungsten (W), aluminum (Al), copper (Cu), nickel (Ni), cobalt (Co), polysilicon, and/or doped polysilicon.

Figure 10C:
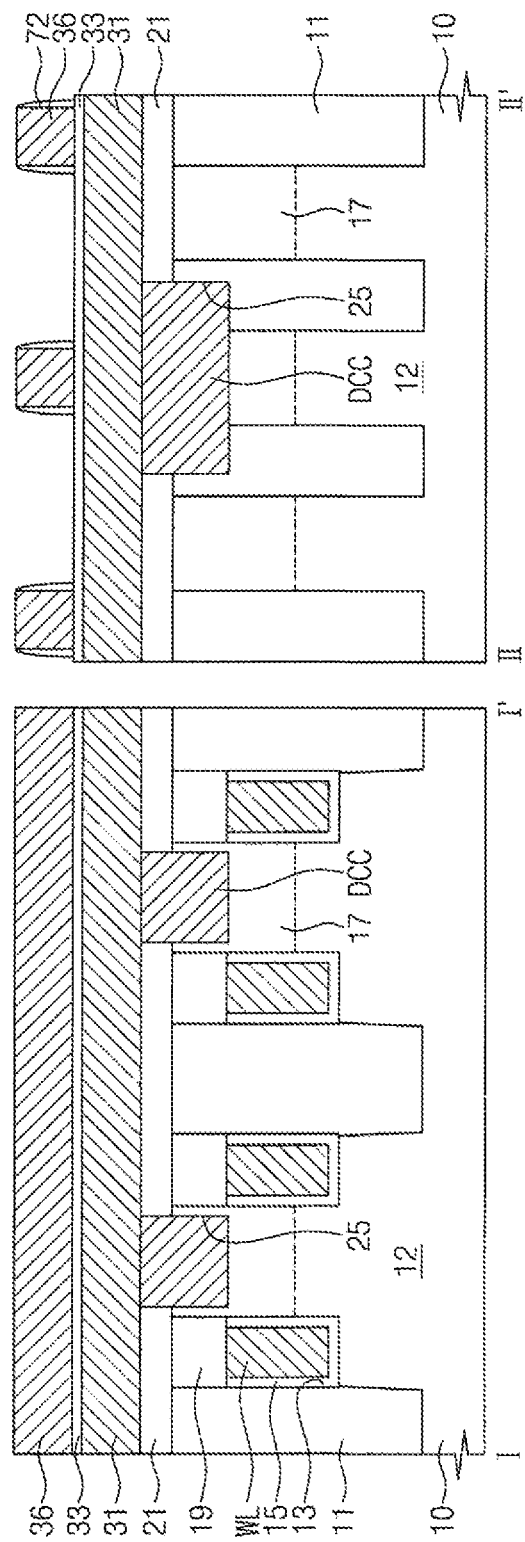

Referring to FIG. 10C, an etch-back process may be performed on the seed layer 71 to form seed patterns 72 on sidewalls of the third bit line patterns 36. In some embodiments of the present inventive concepts, during the etching of the seed layer 71, the second electrode layer 33 may be partially etched between the third bit line patterns 36.

Figure 10D:
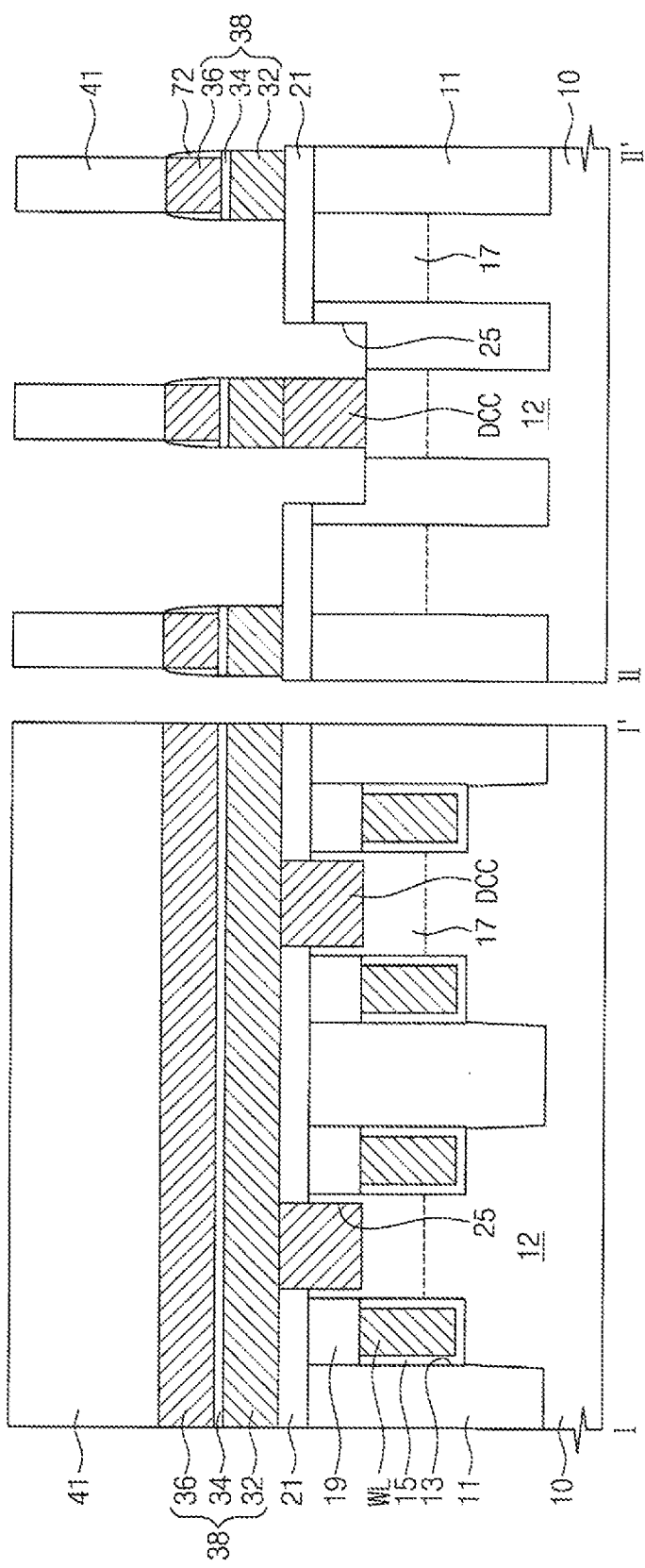

Referring to FIG. 10D, the insulating patterns 41 may be formed on the third bit line patterns 36, respectively. The insulating patterns 41 may be formed at substantially the same positions as the removed second masks 39. The second electrode layer 33, the first electrode layer 31, and the BL contact DCC, which are exposed by the insulating patterns 41, may be etched using the insulating patterns 41 as an etch mask. For example, the first electrode layer 31 may be etched to form the first bit line patterns 32, and the second electrode layer 33 may be etched to form the second bit line patterns 34. In the present embodiments, ones of the bit line patterns 38 may include the first to third bit line patterns 32, 34, and 36. The BL contacts DCC may be formed in the contact holes 25, respectively.

Figure 10E:
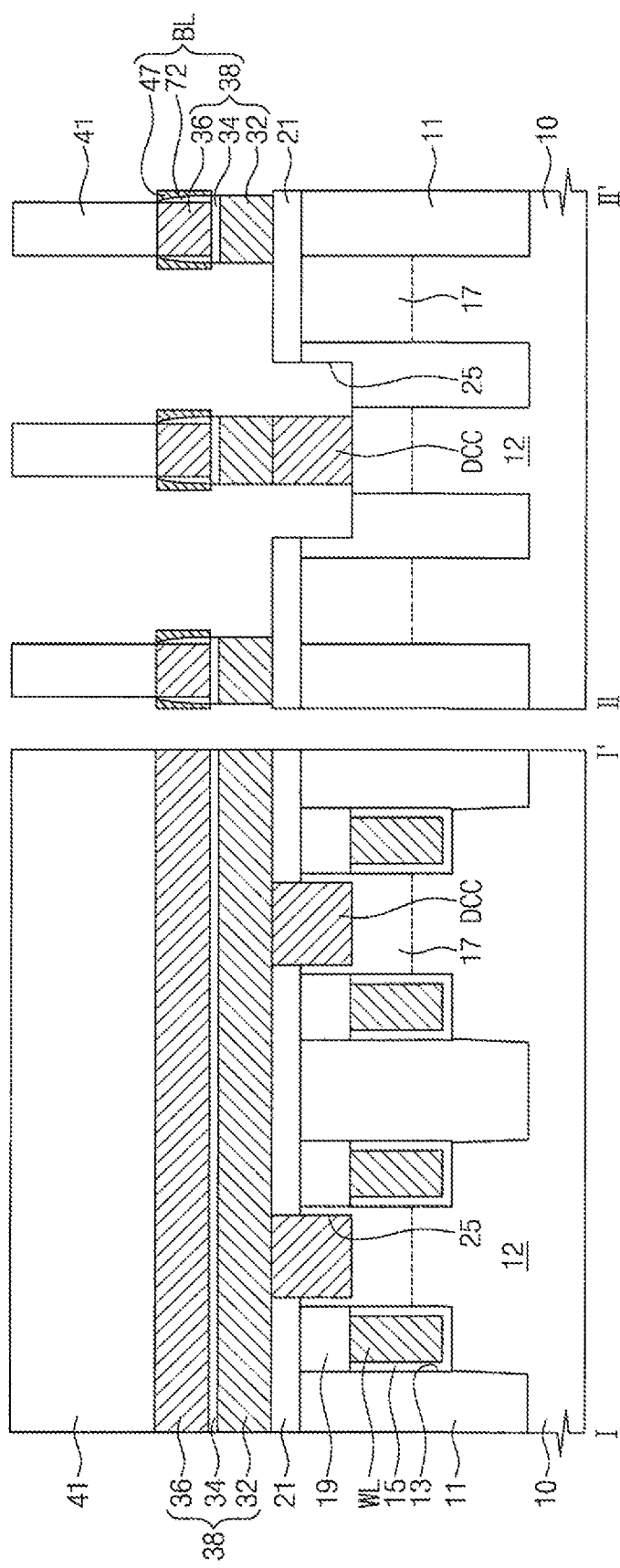

Referring to FIG. 10E, the graphene patterns 47 may be formed on sidewalls of the seed patterns 72. The graphene patterns 47 may be formed using the graphene forming method described with reference to FIG. 9J. In the case where the first to third electrode layers 31, 33, and 35 are formed of conductive materials that do not allow the growth of the graphene, the seed patterns 72 may be formed to contain a conductive material allowing the growth of the graphene, and the graphene patterns 47 may be grown from such seed patterns 72. The seed patterns 72 may be formed of or include, for example, titanium nitride (TiN), titanium/titanium nitride (Ti/TiN), titanium silicon nitride (TiSiN), tantalum nitride (TaN), tungsten nitride (WN), tungsten (W), aluminum (Al), copper (Cu), nickel (Ni), cobalt (Co), polysilicon, and/or doped polysilicon. In the case where process conditions (e.g., temperature, source material, or power) in a graphene forming process are changed, the graphene patterns 47 can be formed on the seed patterns 72 made of various materials.

Figure 10F:
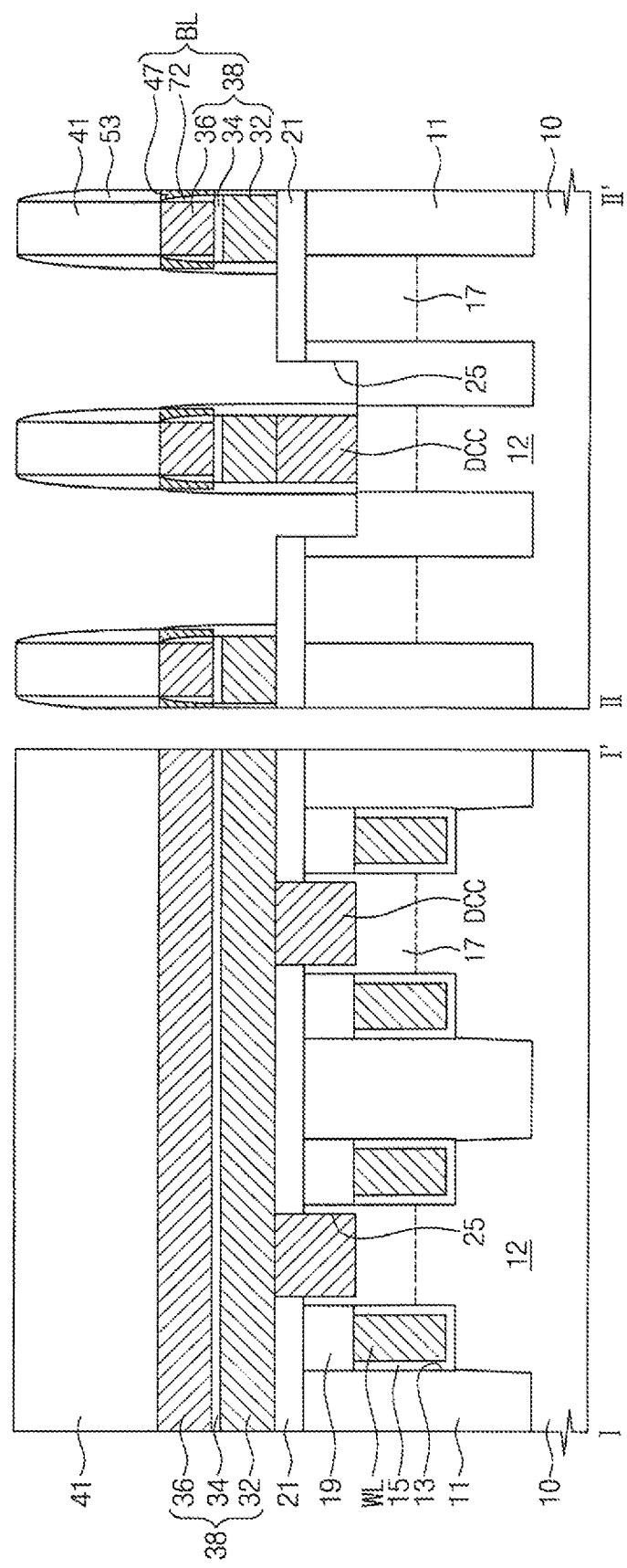

Referring to FIG. 10F, the second spacers 53 may be formed on sidewalls of the bit line patterns 38 and the insulating patterns 41. The second spacers 53 may be formed to cover sidewalls of the seed patterns 72, the graphene patterns 47, and the BL contact DCC.

Figure 10G:
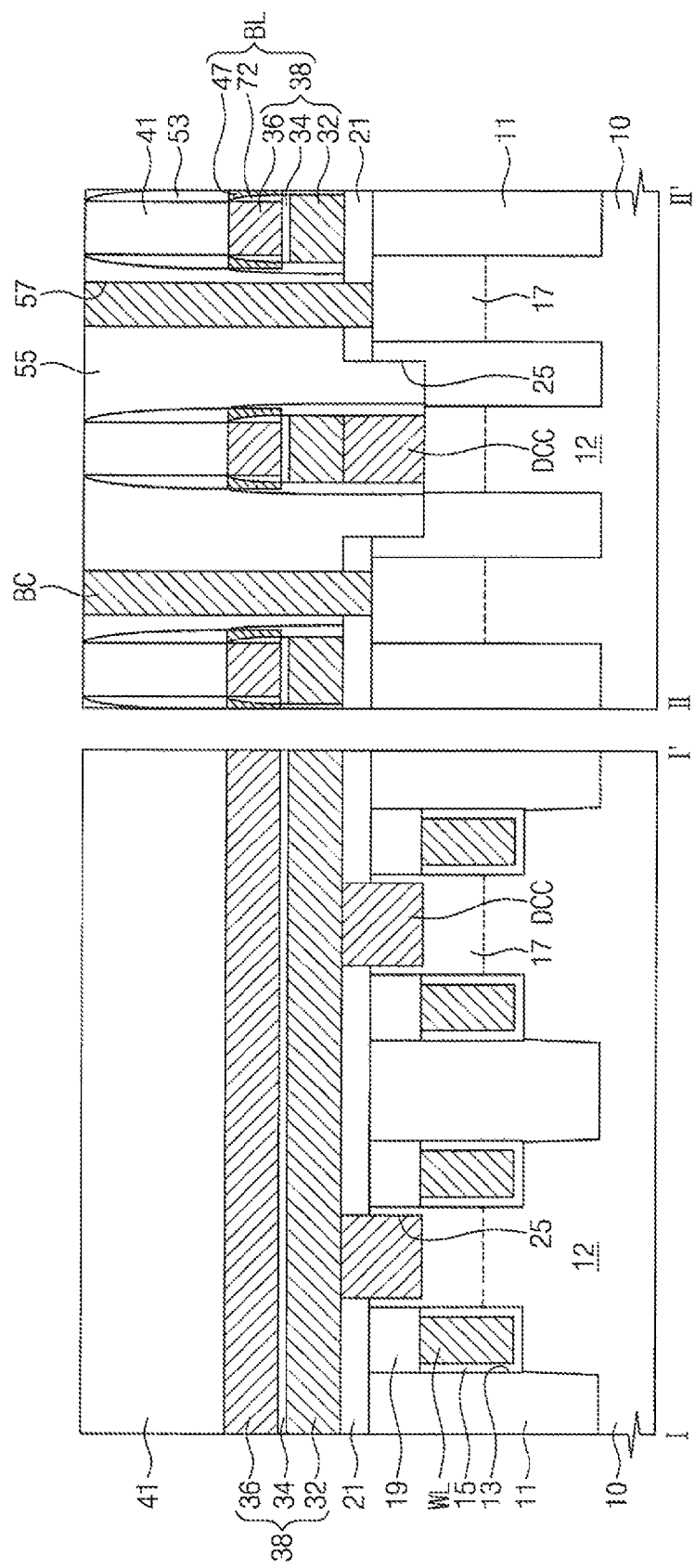

Referring to FIG. 10G, the second interlayered insulating layer 55 may be formed on the first interlayered insulating layer 21. The second interlayered insulating layer 55 may be formed to expose top surfaces of the insulating patterns 41. The second interlayered insulating layer 55 may be formed to fill portions of the contact holes 25. In some embodiments, the second interlayered insulating layer 55 may be formed to completely fill the contact holes 25.

Through holes 57 may be formed to penetrate the first and second interlayered insulating layers 21 and 55 and expose the source/drain regions 17. Then, the storage contacts BC may be formed by filling the through holes 57 with a conductive material.

Referring to FIG. 3, the capacitors CP may be formed on the storage contacts BC, respectively. In some embodiments, a capacitor CP may include the lower electrode 61, the dielectric layer 63, and the upper electrode 65, and the upper electrode 65 may be used as a common electrode of the capacitor CP. In example embodiments, the lower electrode 61 may include the first lower electrode 61a and the second lower electrode 61b. The first lower electrode 61a may be formed on the storage contact BC, and the second lower electrode 61b may be formed to conformally cover a surface of the first lower electrode 61a. The dielectric layer 63 may be formed to conformally cover a surface of the second lower electrode 61b and a top surface of the second interlayered insulating layer 55. The upper electrode 65 may be formed on the second interlayered insulating layer 55 to cover the dielectric layer 63.

Figure 11A:
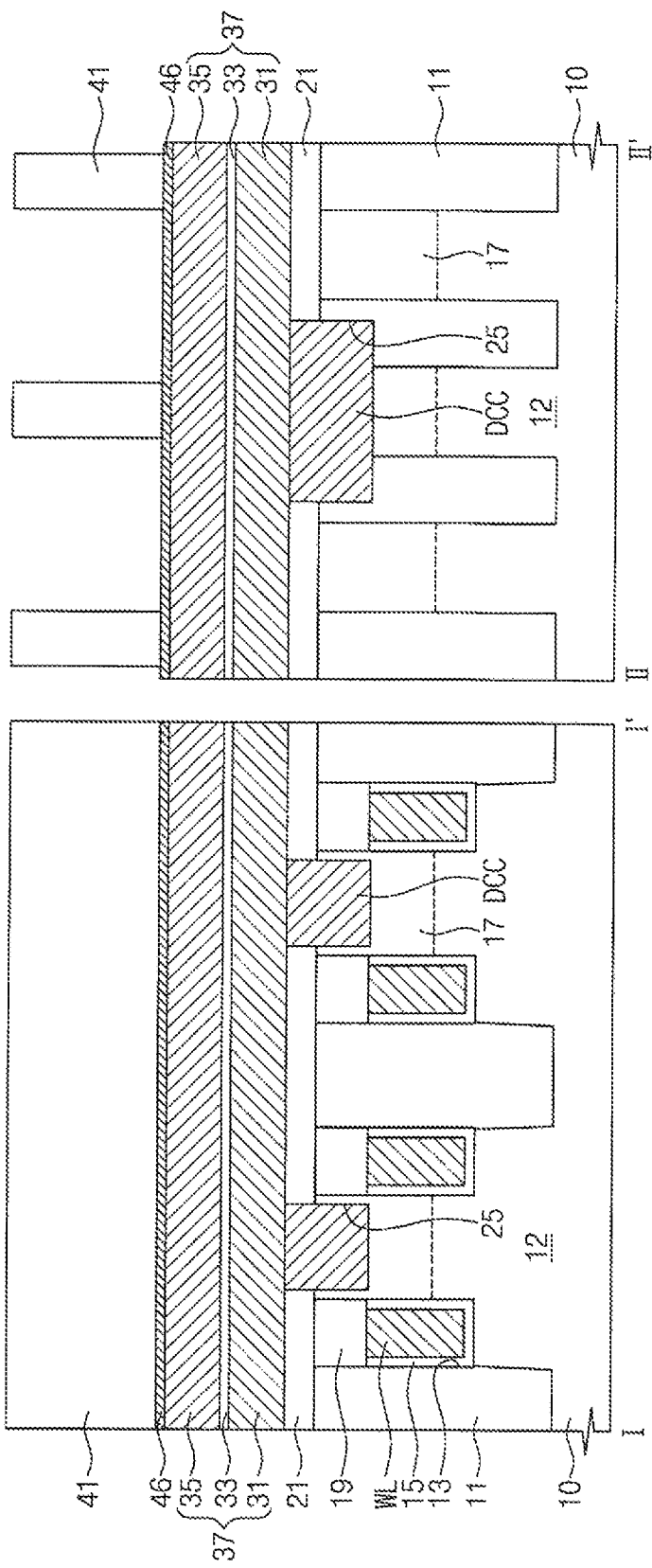
FIGS. 11A through 11C are sectional views taken along lines I-I' and II-II' of FIG. 1 to illustrate methods of fabricating semiconductor devices, according to still other example embodiments of the present inventive concepts.
Figure 11B:
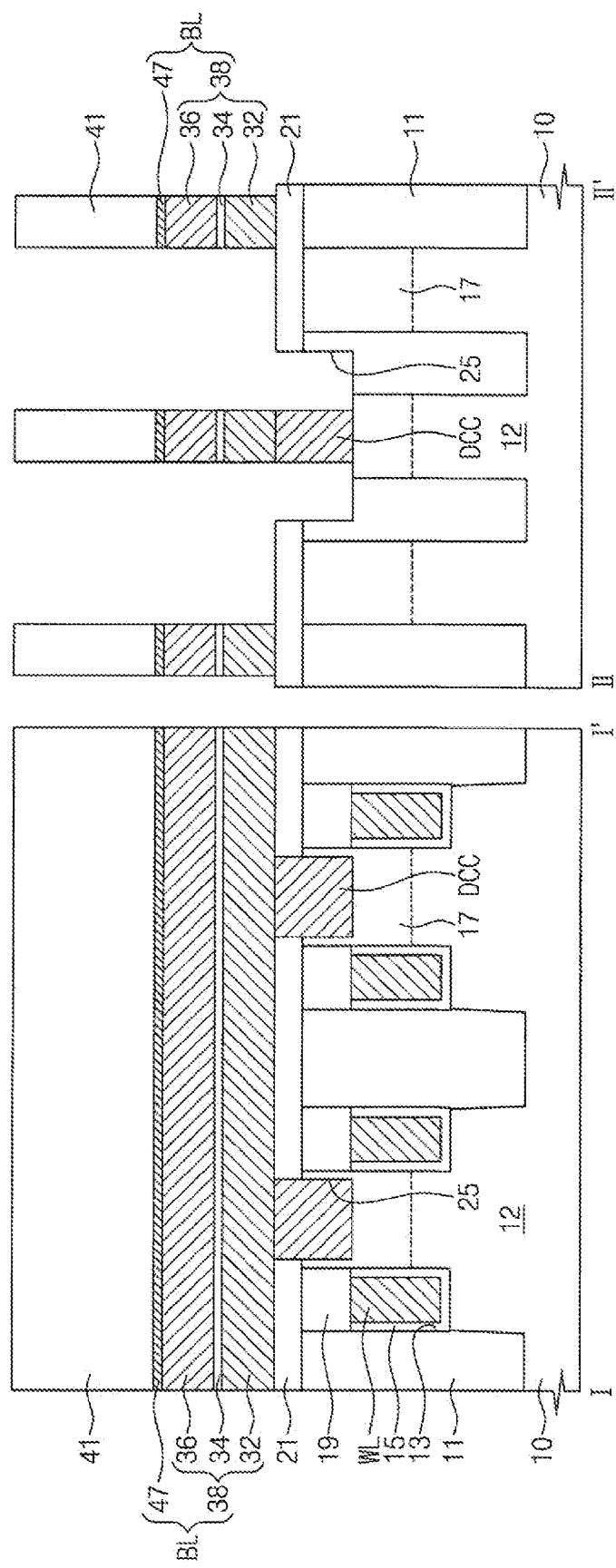
Figure 11C:
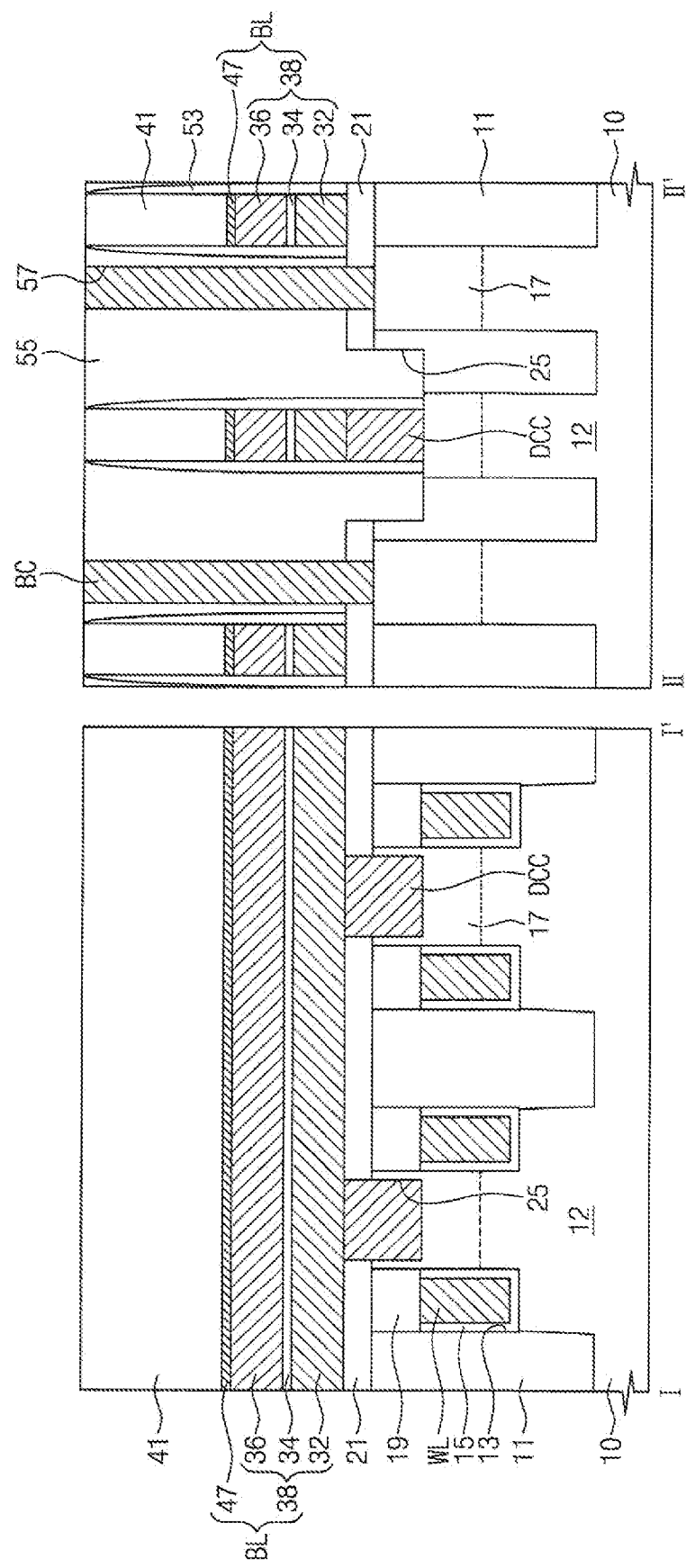

FIG. 4 is a sectional view taken along lines I-I' and II-II' of FIG. 1 to illustrate semiconductor devices according to still other example embodiments of the present inventive concepts. FIGS. 11A through 11C are sectional views taken along lines I-I' and II-II' of FIG. 1 to illustrate methods of fabricating semiconductor devices according to still other example embodiments of the present inventive concepts. For concise description, a previously described element or step may be identified by a similar or identical reference number without repeating an overlapping description thereof.

Referring to FIG. 11A, a graphene layer 46 may be formed on the third electrode layer 35 of FIG. 9F. The graphene layer 46 may be formed using the process described herein for forming the graphene patterns 47. The graphene layer 46 may include a plurality of graphene films 91 sequentially stacked on the third electrode layer 35. For example, the graphene films 91 of the graphene layer 46 may be formed to be parallel to a surface of a seed layer thereof, as shown in FIG. 8A.

Further, ones of the graphene films 91 may be formed to cover the top surface of the third bit line pattern 36 in a substantially continuous manner, as shown in FIG. 8A. The graphene patterns 47 may be formed to have a single crystalline structure. Referring to FIG. 8B, the graphene films 91 of the graphene patterns 47 may be formed to cover the top surface of the third bit line pattern 36 in a substantially discontinuous manner. The graphene patterns 47 may be formed to have a polycrystalline structure.

Thereafter, the insulating patterns 41 may be formed on the graphene layer 46.

Referring to FIG. 11B, the graphene layer 46, the third electrode layer 35, the second electrode layer 33, and the first electrode layer 31 may be etched using the insulating patterns 41 as an etch mask. Accordingly, the first bit line patterns 32, the second bit line patterns 34, the third bit line patterns 36, and the graphene patterns 47 may be formed on the substrate 10. The first to third bit line patterns 32, 34, and 36 may constitute the bit line patterns 38. The bit line patterns 38 and the graphene pattern 47 may constitute the bit lines BL. After the formation of the first bit line patterns 32, the BL contacts DCC may be patterned in such a way that ones of the BL contacts DCC are located below corresponding ones of the bit line patterns 38.

Referring to FIG. 1C, the second spacers 53 may be formed to cover sidewalls of the bit lines BC and the insulating patterns 41. Further, the second spacers 53 may be formed to cover sidewalls of the BL contacts DCC.

The second interlayered insulating layer 55 may be formed on the substrate 10 provided with the first interlayered insulating layer 21. The second interlayered insulating layer 55 may be formed to fill portions of the contact holes 25. In some embodiments, the second interlayered insulating layer 55 may be formed to fill the remaining spaces of the contact holes 25. The through holes 57 may be formed in the second interlayered insulating layer 55. The through holes 57 may be filled with the storage contacts BC, respectively.

Referring to FIG. 4, the capacitors CP may be formed on the storage contacts BC, respectively. In some embodiments, a capacitor CP may include the lower electrode 61, the dielectric layer 63, and the upper electrode 65. The lower electrode 61 may include the first lower electrode 61a and the second lower electrode 61b. The dielectric layer 63 may be formed to conformally cover the top surface of the second interlayered insulating layer 55 and a surface of the second lower electrode 61b. The upper electrodes 65 may be formed on the second interlayered insulating layer 55 to cover the dielectric layer 63.

Figure 12A:
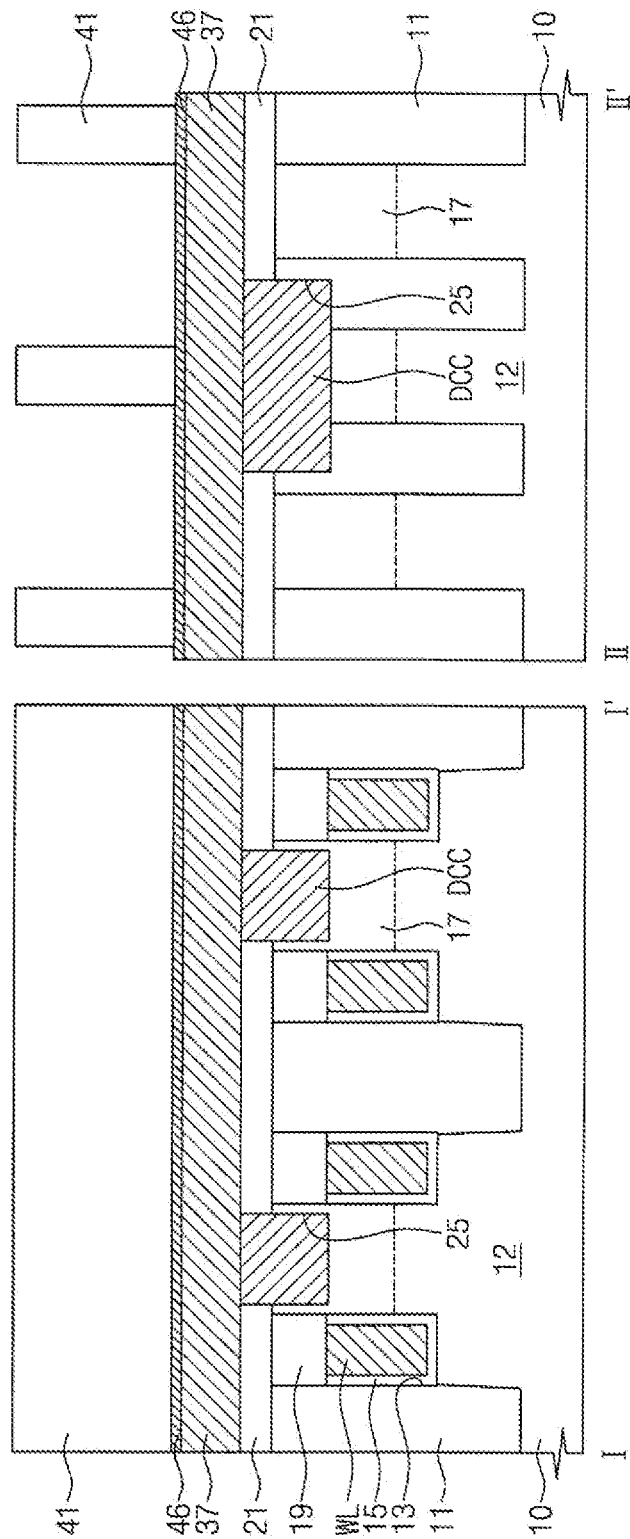
FIGS. 12A through 12C are sectional views taken along lines I-I' and II-II' of FIG. 1 to illustrate methods of fabricating semiconductor devices, according to further example embodiments of the present inventive concepts.
Figure 12B:
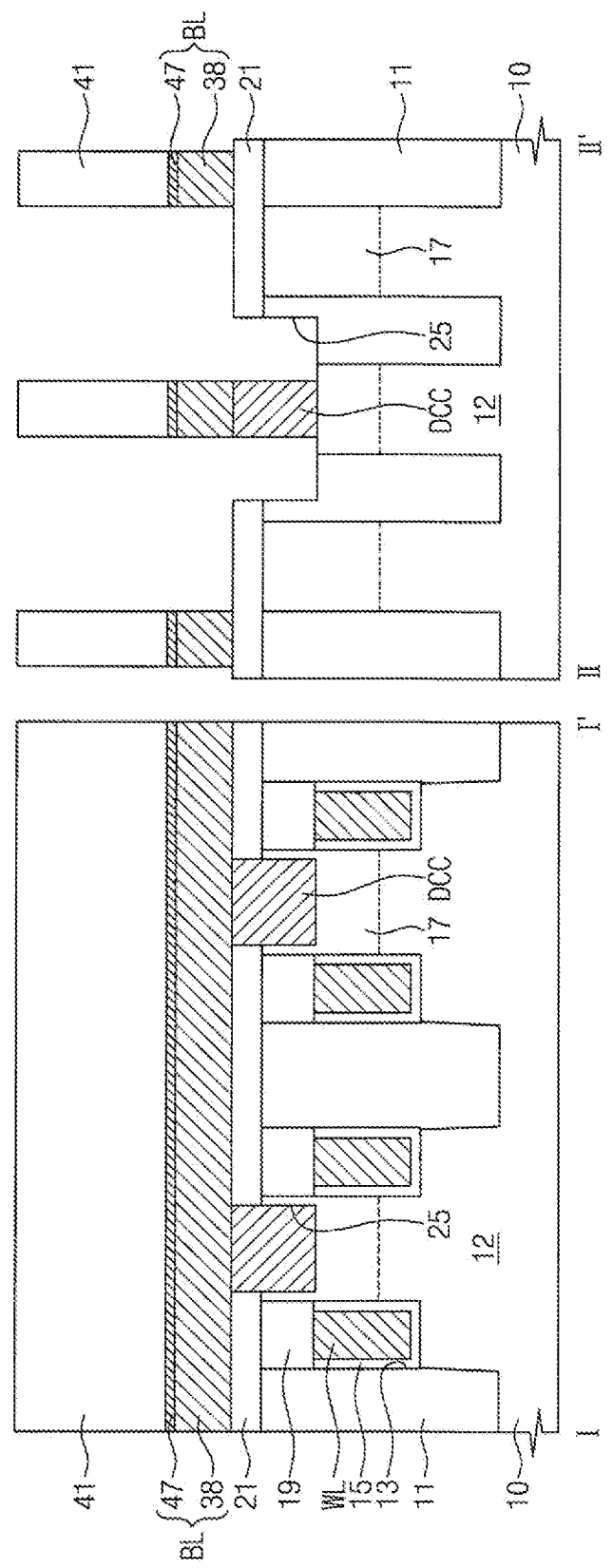
Figure 12C:
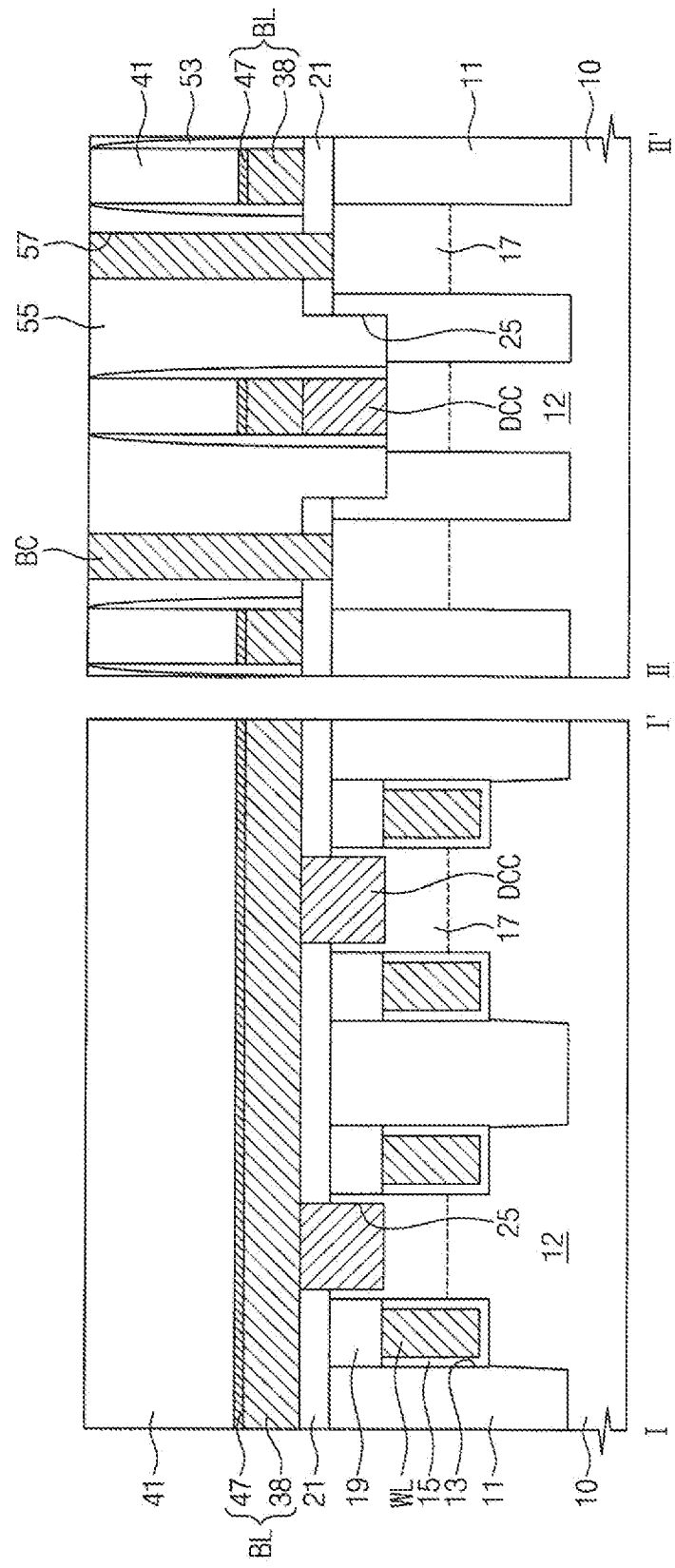

FIG. 5 is a sectional view taken along lines I-I' and II-II' of FIG. 1 to illustrate semiconductor devices according to further example embodiments of the present inventive concepts. FIGS. 12A through 12C are sectional views taken along lines I-I' and II-II' of FIG. 1 to illustrate methods of fabricating semiconductor devices, according to further example embodiments of the present inventive concepts. For concise description, a previously described element or step may be identified by a similar or identical reference number without repeating an overlapping description thereof.

Referring to FIG. 12A, the electrode layer 37 and the graphene layer 46 may be formed on the first interlayered insulating layer 21 of FIG. 9F. The electrode layer 37 may be a single layer. The electrode layer 37 may include, for example, a polysilicon layer or a doped polysilicon layer. The insulating patterns 41 may be formed on the graphene layer 46.

Referring to FIG. 12B, the graphene layer 46 and the electrode layer 37 may be sequentially etched using the insulating patterns 41 as an etch mask. Accordingly, the bit line patterns 38 may be formed on the substrate 10. After the formation of the bit line patterns 38, the BL contacts DCC may be patterned in such a way that ones of the BL contacts DCC are located below corresponding ones of the bit line patterns 38.

Referring to FIG. 12C, the second spacers 53 may be formed to cover sidewalls of the bit lines BC and the insulating patterns 41. Further, the second spacers 53 may be formed to cover sidewalls of the BL contacts DCC.

The second interlayered insulating layer 55 may be formed on the substrate 10 provided with the first interlayered insulating layer 21. The second interlayered insulating layer 55 may be formed to fill portions of the spaces of the contact holes 25. In some embodiments, the second interlayered insulating layer 55 may be formed to fill the remaining spaces of the contact holes 25. Through holes 57 may be formed in the second interlayered insulating layer 55. The through holes 57 may be filled with the storage contacts BC, respectively.

Referring to FIG. 5, the capacitors CP may be formed on the storage contacts BC, respectively. In some embodiments, a capacitor CP may include the lower electrode 61, the dielectric layer 63, and the upper electrode 65, and the upper electrode 65 may be used as a common electrode of the capacitor CP.

Figure 13A:
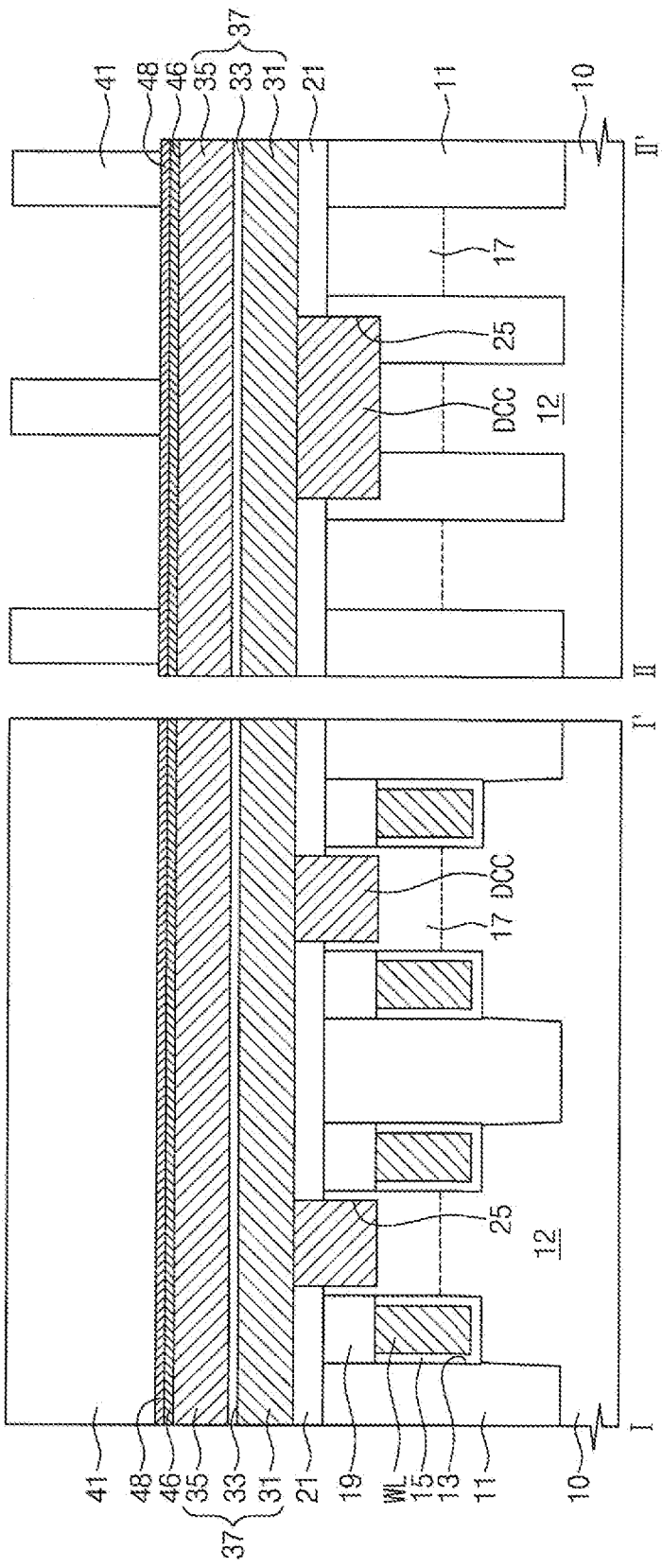
FIGS. 13A through 13C are sectional views taken along lines I-I' and II-II' of FIG. 1 to illustrate methods of fabricating semiconductor devices, according to yet other example embodiments of the present inventive concepts.
Figure 13B:
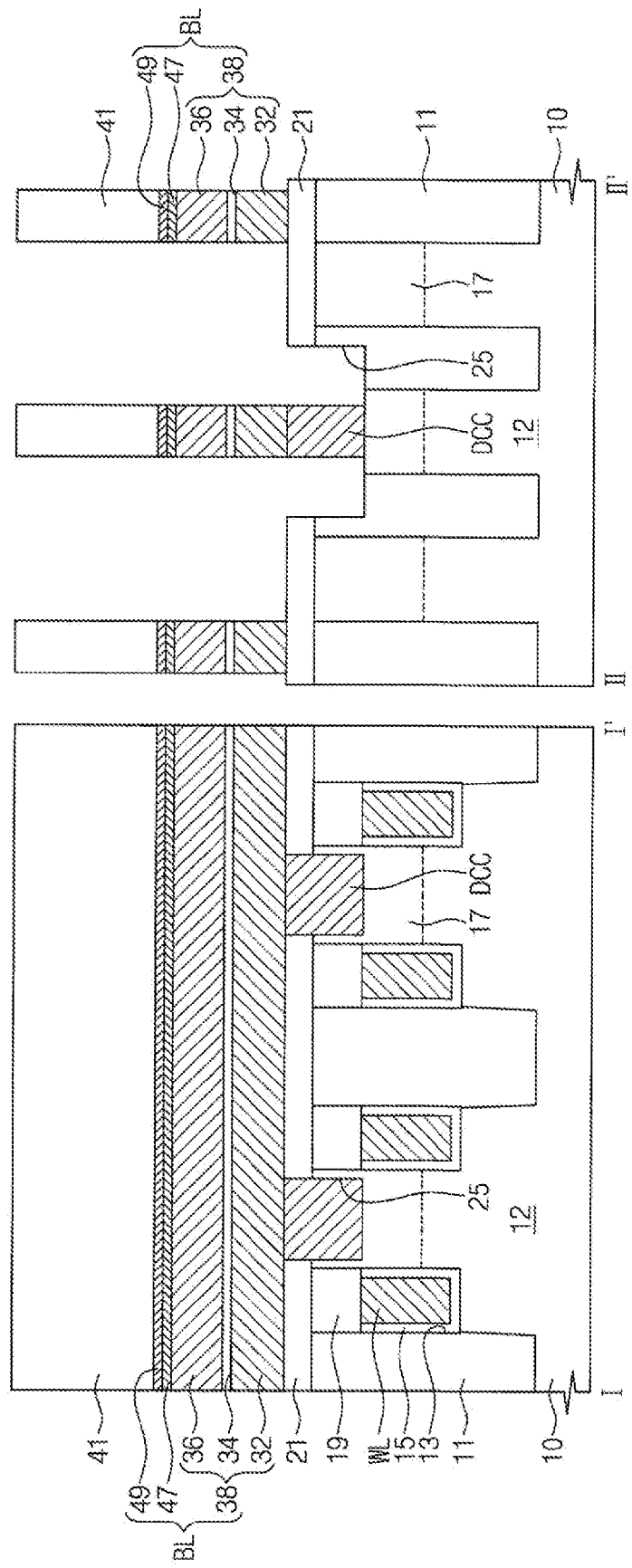
Figure 13C:
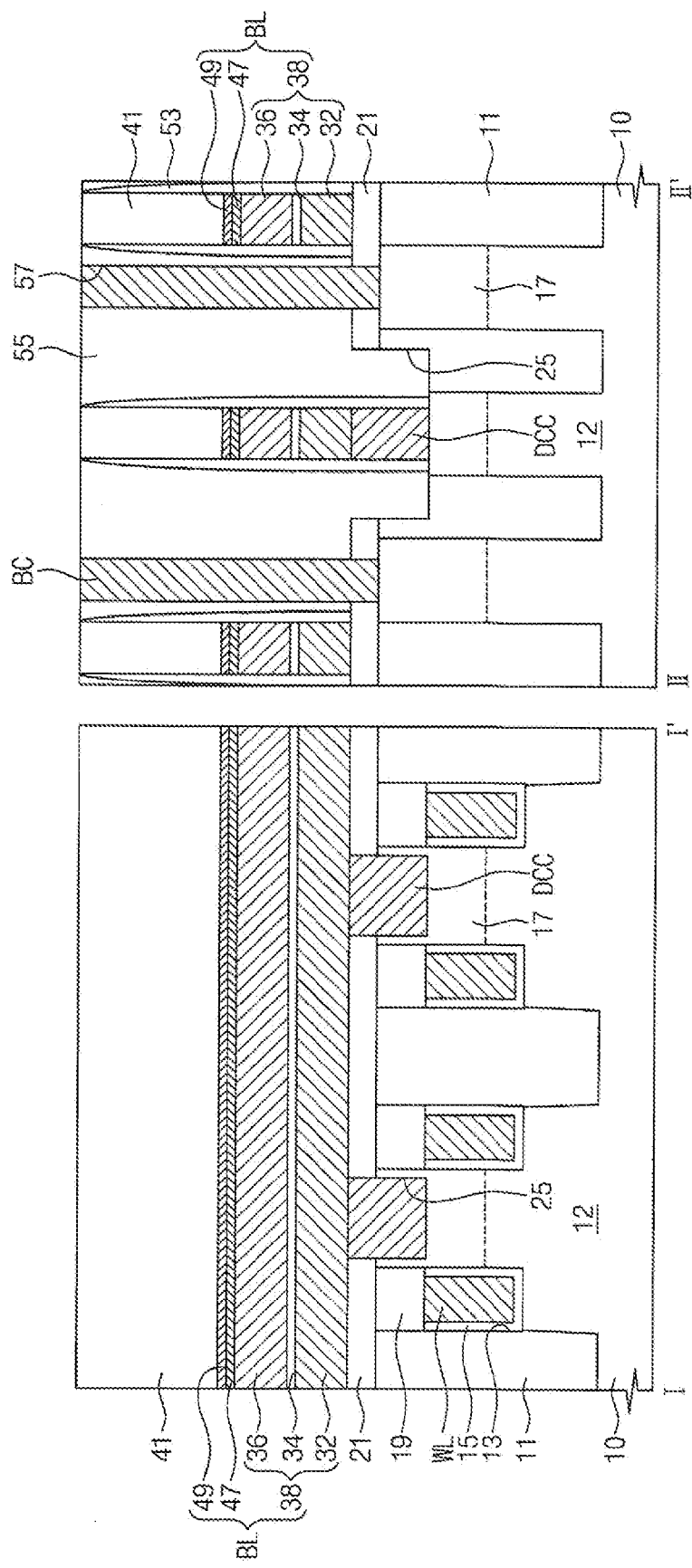

FIG. 6 is a sectional view taken along lines I-I' and II-II' of FIG. 1 to illustrate semiconductor devices according to yet other example embodiments of the present inventive concepts. FIGS. 13A through 13C are sectional views taken along lines I-I' and II-II' of FIG. 1 to illustrate methods of fabricating semiconductor devices, according to yet other example embodiments of the present inventive concepts. For concise description, a previously described element or step may be identified by a similar or identical reference number without repeating an overlapping description thereof.

Referring to FIG. 13A, the graphene layer 46 may be formed on the third electrode layer 35 of FIG. 9G, and a transfer graphene layer 48 may be formed on the graphene layer 46. The graphene layer 46 may be formed using a process described herein for forming the graphene patterns 47. The graphene layer 46 may be formed to have a single crystalline or polycrystalline structure. The transfer graphene layer 48 may be formed by growing a graphene layer on another seed layer, separating the grown graphene layer from the seed layer, and transferring the separated graphene layer onto the graphene layer 46. The transfer graphene layer 48 may be formed to have a single crystalline structure. In the case where the graphene layer 46 has a polycrystalline structure, the graphene layer 46 and the transfer graphene layer 48 may have different crystal structures from each other.

The insulating patterns 41 may be formed on the transfer graphene layer 48.

Referring to FIG. 13B, the transfer graphene layer 48, the graphene layer 46, and the electrode layer 37 may be sequentially etched using the insulating patterns 41 as an etch mask, and thus, the bit line patterns 38, the graphene patterns 47, and transfer graphene patterns 49 may be formed below the insulating patterns 41. Ones of the bit lines BL may include the bit line pattern 38, the graphene pattern 47, and the transfer graphene pattern 49. The BL contacts DCC may be patterned in such a way that ones of the BL contacts DCC are located below corresponding ones of the bit lines BL.

Referring to FIG. 13C, the second spacers 53 may be formed to cover sidewalls of the bit lines BC, the graphene pattern 47, the transfer graphene pattern 49, and the insulating patterns 41. The second spacers 53 may be formed to cover the sidewalls of the BL contact DCC.

Referring to FIG. 6, the capacitors CP may be formed on the storage contact BC. In some embodiments, a capacitor may include the lower electrode 61, the dielectric layer 63, and the upper electrode 65.

Figure 14:
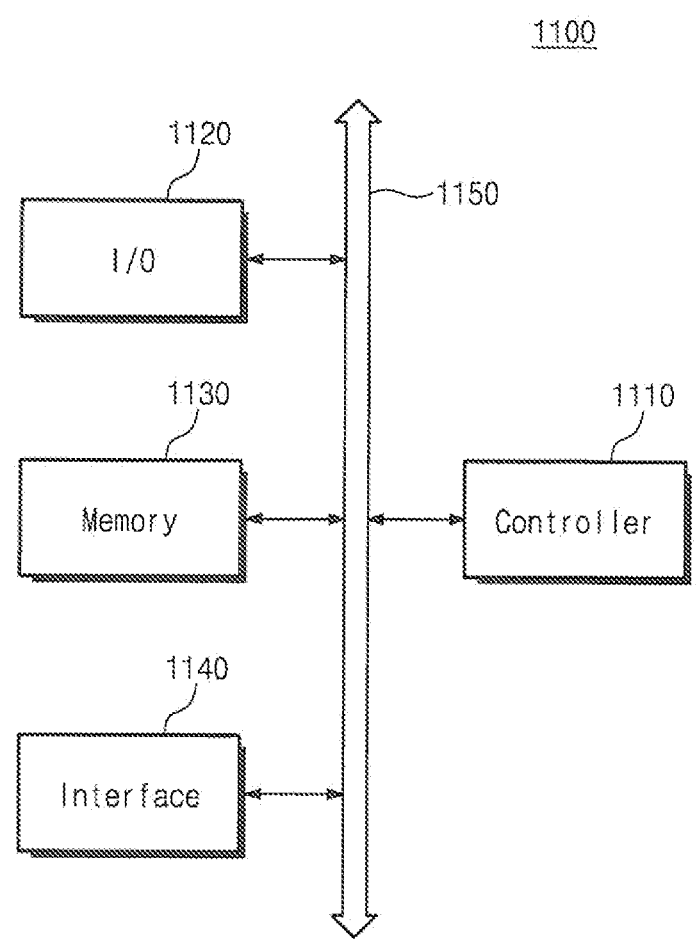
FIG. 14 is a schematic block diagram illustrating an example of electronic systems including semiconductor devices according to example embodiments of the present inventive concepts.

FIG. 14 is a schematic block diagram illustrating examples of electronic systems including semiconductor devices according to example embodiments of the present inventive concepts.

Referring to FIG. 14, an electronic system 1100 according to example embodiments of the present inventive concepts may include a controller 1110, an input/output (I/O) unit 1120, a memory device 1130, an interface unit 1140 and a data bus 1150. The controller 1110, the I/O unit 1120, the memory device 1130 or the interface unit 1140 may communicate with each other through the data bus 1150. The data bus 1150 may correspond to a path through which electrical signals are transmitted. The controller 1110, the input-output unit 1120, the memory device 1130, and/or the interface 1140 may be configured to include semiconductor devices according to example embodiments of the present inventive concepts.

The controller 1110 may include, for example, a microprocessor, a digital signal processor, a microcontroller or another logic device. The other logic devices may have a similar function to any one of the microprocessor, the digital signal processor and the microcontroller. The I/O unit 1120 may include, for example, a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a DRAM device and/or a SRAM device that acts as a cache memory for improving an operation of the controller 1110.

The electronic system 1100 may be applied, for example, to a personal digital assistant (PDA), a portable computer, a web tablet, a wireless phone, a mobile phone, a digital music player, a memory card or an electronic product. The electronic product may receive or transmit information data wirelessly.

Figure 15:
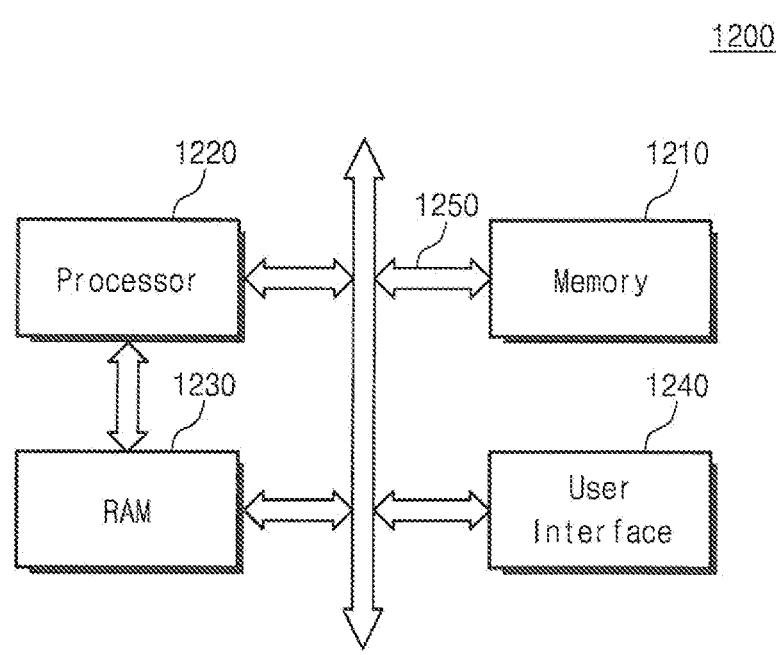
FIG. 15 is a schematic block diagram illustrating another example of electronic systems including semiconductor devices according to embodiments of the present inventive concepts.

FIG. 15 is a schematic block diagram illustrating another example of electronic systems including semiconductor devices according to embodiments of the present inventive concepts.

Referring to FIG. 15, an electronic system 1200 may include the semiconductor devices according to the example embodiments mentioned above. For example, the electronic system 1200 may include a mobile device or a computer. As an illustration, the electronic system 1200 may include a memory system 1210, a processor 1220, a random access memory (RAM) 1230, and a user interface 1240 that that are electrically connected to a bus 1250. The processor 1220 may be configured to execute programs and control the electronic system 1200. The RAM 1230 may be used as an operating memory of the processor 1220. For example, the processor 1220 and/or the RAM 1230 may include the semiconductor devices according to example embodiments of the present inventive concepts. In some embodiments, the processor 1220 and the RAM 1230 may be provided as components of a semiconductor package. The user interface 1240 may be used to input/output data to/from the electronic system 1200. The memory system 1210 may be configured to store code for operating the processor 1220, data processed by the processor 1220 or data input from the outside. The memory system 1210 may include a controller and a memory device.

The electronic system 1200 may be realized, for example, as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and/or an information transmit/receive system, among others. When the electronic system 1200 performs wireless communication, the electronic system 1200 may be used in a communication interface protocol of a communication system such as, for example, CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, and/or MMDS, among others.

According to example embodiments of the present inventive concepts, it is possible to form graphene patterns directly on various conductive materials constituting a semiconductor device. This makes it possible to use the graphene pattern, whose resistivity is lower than that of copper, for semiconductor devices. In other words, the semiconductor devices can be fabricated to have electrodes with low resistivity.

While example embodiments of the present inventive concepts have been particularly shown and described, it will be understood by one of ordinary skill in the art that variations in form and detail may be made therein without departing from the spirit and scope of the attached claims.

What is claimed is:
1. A semiconductor device, comprising:
  a substrate comprising an active region defined by a device isolation layer;
  source/drain regions in the active region;
  word lines that extend in a first direction parallel to the active region and that are arranged in a second direction crossing the first direction;
  a bit line pattern that extends in the second direction and that crosses over a portion of the active region positioned between the word lines; and
  a graphene pattern that covers at least a portion of the bit line pattern.

2. The device of claim 1, wherein the bit line pattern comprises a first bit line pattern, a second bit line pattern, and a third bit line pattern that are sequentially stacked on the substrate, and
  wherein the graphene pattern is on a sidewall of the third bit line pattern.

3. The device of claim 1, wherein the bit line pattern comprises a first bit line pattern, a second bit line pattern, a third bit line pattern, that are sequentially stacked on the substrate, and a seed pattern on a sidewall of the third bit line pattern, and
  wherein the graphene pattern is on the seed pattern.

4. The device of claim 3, wherein the first and second bit line patterns have substantially a same width, and
  wherein a sum of widths of the third bit line pattern and the seed pattern is substantially equal to a width of one of the first or second bit line patterns.

5. The device of claim 1, wherein the graphene pattern is on a top surface of the bit line pattern.

6. The device of claim 5, wherein the graphene pattern comprises a first graphene pattern and a second graphene pattern that are sequentially stacked on the top surface of the bit line pattern, and wherein the first graphene pattern has a first crystal structure and the second graphene pattern has a second crystal structure that is different from the first crystal structure.

7. The device of claim 6, wherein the first and second graphene patterns comprise a plurality of stacked graphene films,
wherein the graphene films of the first graphene pattern cover the top surface of the bit line pattern in a substantially discontinuous and parallel manner, and
wherein the graphene films of the second graphene pattern cover the top surface of the bit line pattern in a substantially continuous and parallel manner.

8. The device of claim 1, further comprising, an interlayered insulating layer on the substrate that covers the bit line pattern and the graphene pattern;
a storage node contact that penetrates the interlayered insulating layer and that is in contact with one of the source/drain regions; and
a capacitor on the storage node contact.

9. The device of claim 8, wherein the capacitor comprises a lower electrode, a dielectric layer that covers the lower electrode, and an upper electrode that covers the dielectric layer,
wherein the lower electrode comprises a first lower electrode and a second lower electrode that covers the first lower electrode, and
wherein the second lower electrode comprises graphene.

10. The device of claim 2, wherein the first bit line pattern comprises polysilicon or doped polysilicon.

11. The device of claim 2, wherein the second bit line pattern comprises TiN, Ti/TiN, TiSiN, TaN, and/or WN.

12. The device of claim 2, wherein the third bit line pattern comprises tungsten, aluminum, copper, nickel, and/or cobalt.

13. A semiconductor device, comprising:
a substrate comprising an active region defined by a device isolation layer;
a bit line that crosses over a portion of the active region and that comprises:
a plurality of bit line patterns that are sequentially stacked on the substrate, wherein at least one bit line pattern of the plurality of bit line patterns comprises a different material than another one of the plurality of bit line patterns; and
a graphene pattern that is on one of the plurality of bit line patterns; and
an interlayered insulating layer that is on the substrate, on the plurality of bit line patterns, and on the graphene pattern.

14. The semiconductor device of claim 13, wherein the graphene pattern comprises a plurality of stacked graphene films.

15. The semiconductor device of claim 14, wherein a bit line pattern of the plurality of bit line patterns has a surface covered by the graphene pattern.

16. The semiconductor device of claim 15, further comprising:
a seed pattern that is between the graphene pattern and the surface of the bit line pattern of the plurality of bit line patterns covered by the graphene pattern, and
wherein the bit line pattern of the plurality of bit line patterns with the surface covered by the graphene pattern has a smaller width than another one of the plurality of bit line patterns.

17. The semiconductor device of claim 15, wherein the graphene pattern comprises a first graphene pattern and a second graphene pattern that are sequentially stacked parallel to a top surface of the plurality of bit line patterns, and
wherein the first graphene pattern has a first crystal structure and the second graphene pattern has a second crystal structure that is different from the first crystal structure.

* * * * *